United States Patent
Chon et al.

(10) Patent No.: US 12,237,818 B2
(45) Date of Patent: Feb. 25, 2025

(54) AUDIO SIGNAL PROCESSING METHOD AND DEVICE FOR CONTROLLING LOUDNESS LEVEL

(71) Applicant: GAUDIO LAB, INC., Seoul (KR)

(72) Inventors: Sangbae Chon, Seoul (KR); Kyutae Park, Seoul (KR); Younghoon Kwon, Seoul (KR); Hyunoh Oh, Seoul (KR); Jeonghun Seo, Seoul (KR); Taegyu Lee, Seoul (KR); Hyunjoo Chung, Seoul (KR)

(73) Assignee: GAUDIO LAB, INC., Seoul (KR)

(*) Notice: Subject to any disclaimer, the term of this patent is extended or adjusted under 35 U.S.C. 154(b) by 0 days.

(21) Appl. No.: 18/375,441

(22) Filed: Sep. 29, 2023

(65) Prior Publication Data

US 2024/0030881 A1    Jan. 25, 2024

Related U.S. Application Data

(63) Continuation of application No. 17/700,494, filed on Mar. 22, 2022, now Pat. No. 11,791,789, which is a
(Continued)

(30) Foreign Application Priority Data

Mar. 14, 2019 (KR) .................. 10-2019-0029517
Oct. 7, 2019 (KR) .................. 10-2019-0124150

(51) Int. Cl.
*H03G 3/00* (2006.01)
*H03G 3/30* (2006.01)

(52) U.S. Cl.
CPC ................. *H03G 3/3089* (2013.01)

(58) Field of Classification Search
CPC .......... H03G 3/3089; H03G 3/32; H03G 3/20; H03G 3/3005; H04R 29/001; H04R 29/004; H04R 2499/11; H04R 29/00
See application file for complete search history.

(56) References Cited

U.S. PATENT DOCUMENTS 9,565,508 B1   2/2017  Skovenborg
11,042,353 B2   6/2021  Cremer et al.
(Continued)

FOREIGN PATENT DOCUMENTS

| CN | 1973434 | 5/2007 |
| CN | 102792588 | 11/2012 |
| CN | 105103222 | 11/2015 |
| CN | 105556837 | 5/2016 |
| CN | 108337606 | 7/2018 |
| CN | 108432130 | 8/2018 |
| JP | 3183637 | 5/2013 |

(Continued)

OTHER PUBLICATIONS

Office Action dated Oct. 30, 2023 for Korean Patent Application No. 10-2023-7005676 and its English translation from Global Dossier.
(Continued)

*Primary Examiner* — Rasha S Al Aubaidi
(74) *Attorney, Agent, or Firm* — WOMBLE BOND DICKINSON (US) LLP

(57) ABSTRACT

An audio signal processing device comprises: a receiver for receiving an input audio signal; a processor for generating loudness metadata corresponding to the input audio signal; and an outputter for transmitting the loudness metadata generated by the processor. The processor is configured to acquire loudness information analyzed from input content, acquires loudness information about the input audio signal by measuring the loudness of the input audio signal, generates the loudness metadata by converting the loudness information, and transmits, through the outputter, the generated loudness metadata to an output device for outputting the input audio signal.

17 Claims, 16 Drawing Sheets

Related U.S. Application Data continuation of application No. 17/053,772, filed as application No. PCT/KR2020/003489 on Mar. 12, 2020, now Pat. No. 11,316,490.

(56) References Cited

U.S. PATENT DOCUMENTS

| | | | |
|---|---|---|---|
| 2010/0250258 | A1 | 9/2010 | Smithers et al. |
| 2012/0306677 | A1 | 12/2012 | Medina et al. |
| 2016/0219391 | A1* | 7/2016 | Ward .................. H04S 1/002 |
| 2017/0094409 | A1 | 3/2017 | Baumgarte |
| 2019/0190477 | A1 | 6/2019 | Travaglini |
| 2021/0367574 | A1 | 11/2021 | Chon et al. |
| 2022/0231649 | A1 | 7/2022 | Chon et al. |

FOREIGN PATENT DOCUMENTS

| | | |
|---|---|---|
| JP | 2013-157659 | 8/2013 |
| JP | 2016-197250 | 11/2016 |
| JP | 2016-534669 | 11/2016 |
| JP | 2018-533046 | 11/2018 |
| KR | 10-2015-0086263 | 7/2015 |
| KR | 10-2016-0072255 | 6/2016 |
| KR | 10-2018-0034565 | 4/2018 |
| WO | 2010/131470 | 11/2010 |

OTHER PUBLICATIONS

International Search Report for PCT/KR2020/003489 mailed on Jul. 8, 2020 and its English translation from WIPO (now published as WO 2020/185025).

Written Opinion of the International Searching Authority for PCT/KR2020/003489 mailed on Jul. 8, 2020 and its English translation by Google Translate (now published as WO 2020/185025).

Office Action dated Dec. 30, 2021 for Korean Patent Application No. 10-2020-7033746 and its English translation provided by Applicant's foreign counsel.

Notice of Allowance dated Dec. 22, 2021 for U.S. Appl. No. 17/053,772 (now published as US 2021/0367574).

Office Action dated Feb. 18, 2023 for Chinese Patent Application No. 202080020871.3 and its English translation provided by Applicant's foreign counsel.

Notice of Allowance dated Mar. 13, 2023 for Japanese Patent Application No. 2021- 555508 and its English translation provided by Applicant's foreign counsel.

Office Action dated Jul. 19, 2022 for Korean Patent Application No. 10-2020-7033746 and its English translation provided by Applicant's foreign counsel.

Office Action dated Sep. 20, 2022 for Japanese Patent Application No. 2021-555508 and its English translation provided by Applicant's foreign counsel.

Notice of Allowance dated Jun. 22, 2023 for U.S. Appl. No. 17/700,494 (now published as US 2022/0231649).

Office Action dated Mar. 2, 2023 for U.S. Appl. No. 17/700,494 (now published as US 2022/0231649).

Office Action dated Jun. 10, 2024 for Japanese Patent Application No. 2023-064367 and its English translation provided by Applicant's foreign counsel.

Notice of Allowance dated Jul. 29, 2024 for Korean Patent Application No. 10-2023-7005676 and its English translation provided by Applicant's foreign counsel.

\* cited by examiner

AUDIO SIGNAL PROCESSING METHOD AND DEVICE FOR CONTROLLING LOUDNESS LEVEL

CROSS-REFERENCE TO RELATED APPLICATIONS

This application is a continuation of U.S. patent Ser. No. 17/700,494 filed on Mar. 22, 2022, which is a continuation of U.S. patent application Ser. No. 17/053,772 filed on Nov. 7, 2020, issued as U.S. Pat. No. 11,316,490 dated Apr. 26, 2022, which is the U.S. National Stage of International Patent Application No. PCT/KR2020/003489 filed on Mar. 12, 2020, which claims the priority to Korean Patent Application No. 10-2019-0029517 filed in the Korean Intellectual Property Office on Mar. 14, 2019, and Korean Patent Application No. 10-2019-0124150 filed in the Korean Intellectual Property Office on Oct. 7, 2019, the entire contents of which are incorporated herein by reference.

TECHNICAL FIELD

The present invention relates to an audio signal processing method and an audio signal processing apparatus for effectively playing back an audio signal, and more particularly, to an audio signal processing method and an audio signal processing apparatus for providing a more immersive audio signal to a user by adjusting the loudness level at which an audio signal of content is output.

BACKGROUND ART

As a method for providing audio to a user has been transformed from analog to digital, it has become possible to play back a sound having a wider volume range. In addition, the volume of an audio signal is diversified according to content corresponding to the audio signal. This is because, in the process of producing audio content, loudness intended for each audio content may be set differently. Accordingly, international standards organizations such as the International Telecommunication Union (ITU) and the European Broadcasting Union (EBU) have issued standards for loudness of audio. However, since the methods and criteria for measuring loudness vary by country, it is difficult to apply the standards issued by the international standards organizations.

Content creators attempt to produce content to which loudness is largely mixed and provide the same to a user. This is due to psychological sound characteristics in which when the sound magnitude of an audio signal increases, the sound quality of the audio signal is perceived to have been improved. Accordingly, a competitive race is formed, referred to as a Loudness War. As a result, there is a loudness difference in content itself or between a plurality of content, and a user may experience the inconvenience of having to repeatedly adjust the volume of a device for playing back the corresponding content. Therefore, the convenience of a user using a content playback device, there is a demand for a technology to normalize loudness of audio content.

DISCLOSURE

Technical Problem

In an audio signal processing method by which content including an audio signal is played back, an embodiment of the present invention is to efficiently adjust an output loudness level of corresponding content.

Technical Solution

According to an embodiment of the present invention, an audio signal processing device includes a receiver for receiving an input audio signal, a processor for generating loudness metadata corresponding to the input audio signal, and an outputter for transmitting the loudness metadata generated by the processor. The processor may be configured to acquire loudness information about the input audio signal by measuring the loudness of the input audio signal, generate the loudness metadata by converting the loudness information, and transmit, through the outputter, the generated loudness metadata to an output device for outputting the input audio signal. The loudness information may include information representing the Quality Secure Histogram Index (QSHI) of the input audio signal, and the QSHI may represent a threshold loudness level at which cognitive sound quality damage does not occur.

The processor may be configured to acquire the QSHI based on a loudness histogram of the input audio signal.

The processor may be configured to acquire the loudness histogram based on the distribution of at least one short-term loudness level of the input audio signal, and may acquire the QSHI based on the loudness histogram. The short-term loudness level may be measured in a section shorter than the entire section of the input audio signal.

The loudness histogram may be a magnitude histogram related to a peak envelope or a root-mean-square (RMS) for each section of the input audio signal.

The processor may be configured to predict a loudness parameter based on the loudness histogram of the input audio signal when the input audio signal is output according to a target loudness level, acquire a prediction loudness histogram of the input audio signal based on the predicted loudness parameter, and acquire the QSHI based on the acquired prediction loudness histogram.

The loudness information may include an integrated loudness level of the input audio signal, the QHSI may be greater than the integrated loudness level of the input audio signal, and the integrated loudness level may be a loudness level calculated based on loudness measurements acquired from the set-up point of time set by the audio signal processing apparatus.

The QHSI may be a parameter corrected according to whether post processing is performed on the input audio signal in the output device.

The processor may set the QHSI such that short-term loudness levels of the entire section of the input audio signal output from the output device is less than or equal to a predetermined level.

According to another aspect of the present invention, an audio signal processing apparatus includes a processor for adjusting the output loudness level of an input audio signal. The processor may be configured to receive loudness metadata corresponding to the input audio signal, parse the loudness metadata to acquire loudness information of the input audio signal, determine a loudness gain of the input audio signal based on the loudness information and a target loudness level, and adjust an output loudness level of the input audio signal based on the loudness gain. The loudness information may include information representing the Quality Secure Histogram Index (QSHI) of the input audio signal, and the QSHI may represent a threshold loudness level at which cognitive sound quality damage does not occur.

The processor may be configured to compare the target loudness level of the input audio signal with the QSHI, and determine the loudness gain based on the comparison result.

The processor may be configured to determine the loudness gain based on the smaller of the target loudness level of the input audio signal and the QSHI.

The processor may be configured to receive an integrated loudness level of the input audio signal, and determine the loudness gain based on the integrated loudness level of the input audio signal, the QSHI, and the target loudness level. The integrated loudness level may be a loudness level calculated based on loudness measurements acquired from the set-up point of time set by an apparatus for measuring the loudness of input audio signal.

The QSHI may be a loudness parameter calculated based on a loudness histogram of the input audio signal.

The loudness histogram may be a magnitude histogram of short-term loudness levels over time of the input audio signal, and the short-term loudness level may be measured in a section shorter than the entire section of the input audio signal.

The loudness histogram may be a magnitude histogram related to a peak envelope or a root-mean-square (RMS) for each section of the input audio signal.

The QSHI may be a parameter calculated based on a prediction loudness histogram predicted from the loudness histogram of the input audio signal, and the prediction loudness histogram may be a histogram generated based on a loudness parameter predicted when the input audio signal is output according to the target loudness level.

The QHSI may be greater than the integrated loudness level of the input audio signal, and the integrated loudness level may be a loudness level calculated based on loudness measurements acquired from the set-up point of time set by an apparatus for measuring the loudness of input audio signal.

The processor may be configured to generate an output audio signal by adjusting an output loudness level of the input audio signal according to the loudness gain, and may output the output audio signal by applying a loudness limiter to limit the loudness level of an output audio signal to the output audio signal.

The QSHI may be a loudness parameter determined based on the number of times the limiter is driven in the audio signal processing apparatus.

The processor may be configured to perform post processing on the input audio signal, receive post-processing information representing the characteristics of the post-processing for the input audio signal, correct the acquired QSHI based on the post-processing information, and determine the loudness gain based on the corrected QSHI.

The processor may be configured to correct the QSHI based on the post-processing information and a pre-stored function.

The processor may be configured to correct the QSHI based on the post-processing information and a pre-stored look-up table. The pre-stored look-up table may include information on QSHI correction according to the characteristics of post-processing.

The information on QSHI correction may include information representing a QSHI correction value according to the characteristics of post-processing. The processor may be configured to acquire a QSHI correction value corresponding to the post-processing on the input audio signal based on the pre-stored look-up table, and correct the QSHI by adding the QSHI correction value to the acquired QSHI.

The loudness gain may be a fixed gain having a fixed value in the entire section of the input audio signal.

The loudness gain may be a gain changing over time during the time the input audio signal is played back.

The processor may be configured to generate an output audio signal by adjusting an output loudness level of the input audio signal according to the loudness gain. The QHSI may be a parameter set such that short-term loudness levels of the entire section of the output audio signal are less than or equal to a predetermined level.

Advantageous Effects

In an apparatus and a method according to an embodiment of the present invention, it is possible to effectively normalize the loudness level of an audio signal in playing back content including the audio signal. In addition, the apparatus and the method according to an embodiment of the present invention may provide the convenience for improving sound quality and adjusting volume to the user.

Particularly, according to an embodiment of the present invention, it is possible to control the loudness level without compromising sound quality. In addition, the audio signal processing apparatus according to another aspect of the present invention may provide output content having a more stable output loudness level using loudness metadata. In addition, it is possible to perform loudness normalization, which is close to the loudness that a listener actually perceives.

MODE FOR CARRYING OUT THE INVENTION

Figure 1:
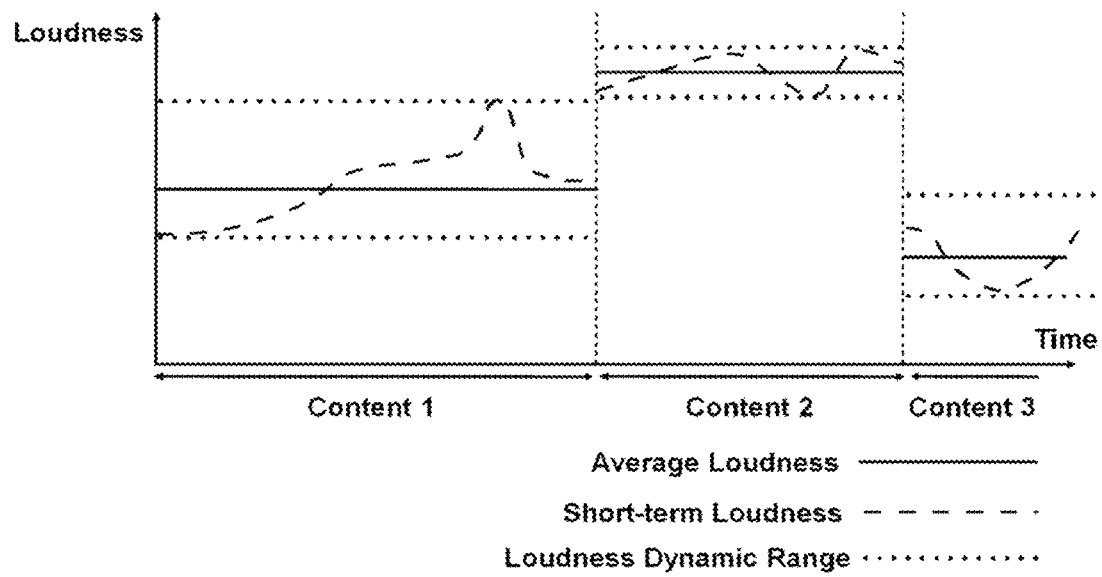
FIG. 1 is a view showing a loudness level changing over time during the time a plurality of content are played pack according to an embodiment of the present invention.

Hereinafter, embodiments of the present invention will be described in detail with reference to the accompanying drawings so that those skilled in the art to which the present invention pertains may easily practice the embodiments. However, the present invention may be embodied in many different forms, and is not limited to the embodiments set forth herein. In addition, in order to clearly describe the present invention, parts irrelevant to the description are omitted in the drawings, and like reference numerals designate like elements throughout the specification. In addition, when a portion is said to 'include' any component, it means that the portion may further include other components rather than excluding the other components unless otherwise stated.

The present disclosure relates to a method by which an audio signal processing apparatus adjusts the output loudness level of input content. In the present disclosure, the input content may be content including an audio signal. In the present disclosure, the input content may be referred to as an input audio signal. In addition, loudness may indicate the magnitude of sound perceived thorough hearing. A loudness level may be a numerical value indicating the loudness. For example, the loudness level may be indicated by using a unit such as Loudness K-Weighted relative to Full Scale (LKFS) or Loudness Unit relative to Full Scale (LUFS). Also, the loudness level may be indicated by using a unit such as sone or phon.

Hereinafter, referring to FIG. 1, the loudness of an audio signal will be described. FIG. 1 is a view showing a loudness level changing over time during the time a plurality of content are played back according to an embodiment of the present invention. Referring to FIG. 1, an average loudness changing over time, a short-term loudness, and a loudness dynamic range are illustrated. An average loudness level may be a single loudness value corresponding to one content. The average loudness level may vary for each content (content1, content2, and content3). In FIG. 1, a solid line represents the average loudness level for each content (content1, content2, and content3). The average loudness of FIG. 1 may represent integrated loudness. The integrated loudness and the short-term loudness described above may follow the definition of a loudness standard, such as ITU-R BS.1770-4, EBU R 128, EBU TECH 3341, and EBU TECH 3342.

According to an embodiment, the short-term loudness level may be a loudness level measured in a section shorter than the entire section of the input audio signal. The short-term loudness level may be a loudness measurement value for a portion of content. In this case, the portion of content may be a portion included in one measurement window. The audio signal processing apparatus may acquire a plurality of short-term loudness levels for one content. In addition, the average loudness level may be the average of the plurality of short-term loudness levels.

In FIG. 1, each of a plurality of contents played back and switched has different loudness characteristics. For example, when different contents are switched in a platform for providing an image providing service, advertising content may be inserted between contents to be switched. In this case, it may be difficult for the audio signal processing apparatus to maintain the loudness level in a predetermined range. Also, the difference in loudness dynamic range between different contents may be large. In such an environment, the audio signal processing apparatus may not be able to provide the loudness level within a range which a listener desires.

Specifically, when contents are switched, the listener may first notice that a short-term loudness level rapidly changes. Accordingly, the listener may need to adjust the volume of a device outputting an audio signal. In addition, as switched content is played back, the listener may need to adjust the volume again to set an appropriate gain according to the average loudness. For example, when the switched content is played back according to a volume adjusted based on the loudness of an initial section of the switched content, a loudness level may rapidly increase or rapidly decrease depending on the characteristics of the content. When the loudness level rapidly increases or rapidly decreases so that it is not possible to recognize the contents of the content, the listener may need to adjust again the volume of the device outputting the audio signal.

Accordingly, the audio signal processing apparatus according to an embodiment of the present invention may control the output loudness level of input content, and thus, may increase listener convenience. Specifically, the audio signal processing apparatus may adjust the loudness level based on the loudness gain of input content. In this case, the audio signal processing apparatus may use loudness metadata including loudness information of the input audio signal.

According to an embodiment of the present invention, the loudness level of input contents created by different criteria or without specific criteria may be normalized based on a target loudness level. Here, the target loudness level may be a loudness level to which the audio signal processing apparatus intends to output. For example, the target loudness level may be set by a content creator of the input content. In this case, the audio signal processing apparatus may receive information on target loudness together with the input content. In addition, the target loudness level may be set to different values depending on the genre of the input content. In this case, the audio signal processing apparatus may determine the target loudness level based on the genre of the input content. The target loudness level may be set to a default value pre-stored in the audio signal processing apparatus. In this case, the target loudness level may be set to a value independent of the input content or the genre of the input content. The audio signal processing apparatus may adjust the output loudness level of the input content based on the target loudness level.

According to an embodiment, the audio signal processing apparatus may acquire a loudness gain based on the relationship between the loudness level of the input content and the target loudness level. The relationship between the loudness level of the input content and the target loudness level may include the difference or ratio between the loudness level of the input content and the target loudness level.

For example, the audio signal processing apparatus may acquire a loudness gain based on the relationship between a representative loudness level of the input content and the target loudness level. Here, the representative loudness level may be a loudness level representing the loudness level for all sections of the input content. The audio signal processing apparatus may receive the representative loudness level of the input content together with the input content. Alternatively, the audio signal processing apparatus may acquire the representative loudness level based on loudness information analyzed from the input content. In this case, the audio signal processing apparatus may acquire the loudness information based on a loudness measurement value for the input content. In the present disclosure, the loudness information of the input audio signal may include loudness metadata converted into a metadata format.

Also, the audio signal processing apparatus may adjust the output loudness level of the input content based on the loudness gain. Specifically, the audio signal processing apparatus may acquire an output audio signal whose loudness level has been adjusted by applying the loudness gain to the input content.

The audio signal processing apparatus according to an embodiment of the present invention may adjust the output loudness level of the input audio signal by using the loudness metadata of the input audio signal. As a result, the audio signal processing apparatus may control the loudness level of the input content without compromising the sound quality of the input audio signal included in the input content.

For example, a predetermined target loudness level may be greater than the representative loudness level of the input audio signal. In this case, when the input audio signal is output according to the predetermined target loudness level, the sound quality may be compromised. Accordingly, the audio signal processing apparatus may acquire the loudness gain based on loudness characteristics and the predetermined target loudness. The audio signal processing apparatus may acquire the loudness gain without compromising the sound quality of the input audio signal based on the loudness characteristics. The audio signal processing apparatus may adjust the output loudness level of the input content based on the acquired loudness gain.

In this case, the audio signal processing apparatus may acquire the loudness information by using the loudness metadata of the input audio signal. Specifically, the audio signal processing apparatus may receive the loudness metadata of the input audio signal from an external device of the audio signal processing apparatus. The external device may analyze loudness characteristics of the input audio signal, and may generate the loudness metadata of the input audio signal based on the analyzed loudness characteristics. In addition, the external device may transmit the loudness metadata of the input audio signal to the audio signal processing apparatus.

Figure 2:
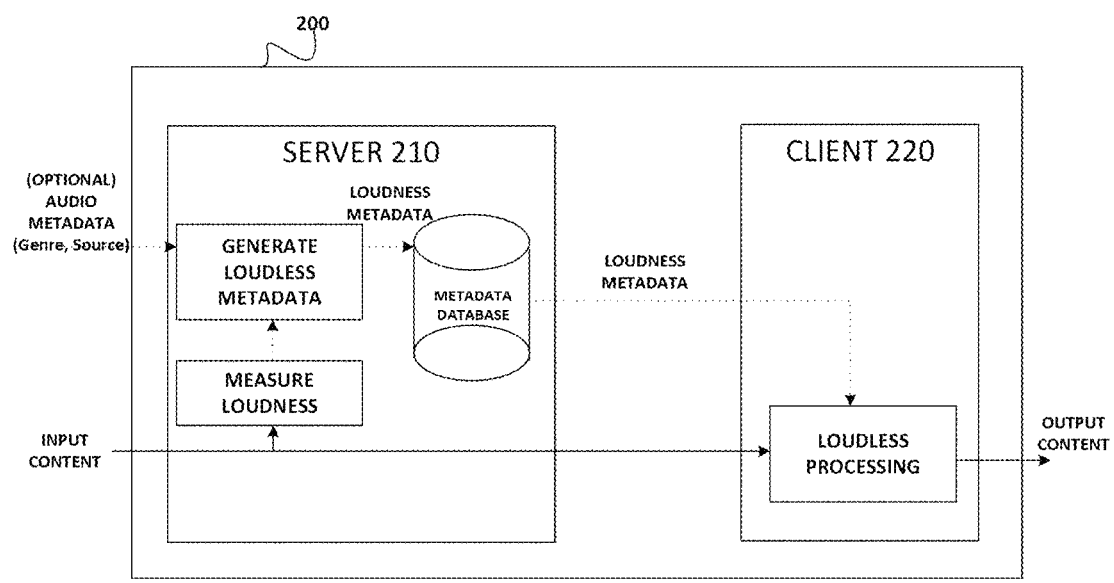
FIG. 2 is a schematic diagram showing a system including a first audio signal processing apparatus and a second audio signal processing apparatus according to an embodiment of the present invention.

Hereinafter, a method for adjusting the output loudness level of input content according to an embodiment of the present invention will be described with reference to FIG. 2. FIG. 2 is a schematic diagram showing a system 200 including a first audio signal processing apparatus 210 and a second audio signal processing apparatus 220 according to an embodiment of the present invention. In FIG. 2, the first audio signal processing apparatus 210 may be a server. In FIG. 2, the second audio signal processing apparatus 220 may be a client device.

FIG. 2 illustrates that a series of operations for the loudness normalization of input content are performed by a system of a server-client structure, but the present disclosure is not limited thereto. For example, the series of operations described with reference to FIG. 2 may be performed by a single audio signal processing apparatus.

According to an embodiment, the first audio signal processing apparatus 210 may generate loudness metadata of an input audio signal. The first audio signal processing apparatus 210 may transmit the generated loudness metadata to the second audio signal processing apparatus 220 which is to output the corresponding input audio signal. The second audio signal processing apparatus 220 may receive the loudness metadata from the first audio signal processing apparatus 210. In addition, the second audio signal processing apparatus 220 may adjust the output loudness level of the input audio signal based on the received loudness metadata. Specifically, the second audio signal processing apparatus 220 may determine a loudness gain to be applied to the input audio signal based on the loudness metadata. In addition, the second audio signal processing apparatus 220 may adjust the loudness level of the input audio signal based on the determined loudness gain.

Specifically, the first audio signal processing apparatus 210 may receive the input content. In the present disclosure, the input content may be an input audio signal composed of a plurality of frames. Next, the first audio signal processing apparatus 210 may measure the loudness level of the input content. The first audio signal processing apparatus 210 may acquire loudness measurement values of an audio signal by using a loudness filter based on an auditory scale. Specifically, the loudness filter may be at least one of an inverse filter of an equal-loudness contours or a K-weighting filter approximating the same.

For example, the first audio signal processing apparatus 210 may acquire loudness measurement values by applying the loudness filter to at least some sections of the input content received. Here, some sections may be a unit time used for acquiring one loudness measurement value. Some sections may include at least one frame. In the present disclosure, the unit time used for acquiring one loudness measurement value may be referred to as a measurement window.

The first audio signal processing apparatus 210 may acquire a loudness measurement value for each measurement window for input content. In this case, the acquired loudness measurement value may be a momentary loudness level or a short-term loudness level depending on the length of a measurement window. The momentary loudness level may be a measurement value measured over a shorter period of time than the short-term loudness level. For example, the length of a measurement window used for acquiring one momentary loudness level may be 400 milliseconds (ms). In addition, the length of a measurement window used for acquiring one short-term loudness level may be 3 seconds. However, the present disclosure is not limited thereto. The length of a measurement window for loudness analysis may vary by input content. According to an embodiment, the length of a measurement window may be determined based on additional information of input content. A method by which the audio signal processing apparatus determines the length of a measurement window will be described later with reference to FIG. 18.

Next, the first audio signal processing apparatus 210 may acquire loudness information of input content based on loudness measurement values for the input content. The loudness information may include at least one loudness measurement value for the input content. Also, the loudness information may include information calculated based on the loudness measurement values for the input content. The first audio signal processing apparatus 210 may update the loudness information in real time. For example, the loudness information may include at least one of an integrated loudness level, a short-term loudness level, or a momentary loudness level. The first audio signal processing apparatus 210 may acquire an integrated loudness level representing a plurality of loudness measurement values integrated from a point of time at which loudness measurement for the input content is started to a current point of time.

In the present disclosure, the integrated loudness level may represent a loudness level integrated from a set-up point of time which has been set in a device for measuring a loudness level. According to an embodiment, the integrated loudness level may be a loudness level calculated based on loudness levels measured from a set-up point of time which has been set in the first audio signal processing apparatus 210. For example, the integrated loudness level may be an average loudness level calculated based on a loudness measurement value for each section acquired from the set-up point of time. In this case, the loudness measurement value for each section may represent either the short-term loudness level or the momentary loudness level.

According to an embodiment, the integrated loudness level may be acquired based on the average of effective loudness measurement values measured from the set-up point of time to the current point of time. Here, the effective loudness measurement values may be loudness measurement values satisfying at least one criterion requirement among the plurality of loudness measurement values measured from the set-up point of time to the current point of time.

For example, the effective loudness measurement values may be loudness measurement values whose loudness levels are above a certain level. First, the first audio signal processing apparatus 210 may calculate a first average for loudness measurement values whose loudness levels are above a first threshold value among the plurality of loudness measurement values. In this case, the first threshold may be a value set based on a minimum audible magnitude. Next, the first audio signal processing apparatus 210 may calculate a second average for loudness measurement values whose loudness levels are above a second threshold among loudness measurement values used for the calculation of the first average. In this case, the second threshold value may be a value acquired by subtracting a predetermined value from the first average. In addition, the first audio signal processing apparatus 210 may use the second average as the integrated loudness level of the input content. Meanwhile, the first audio signal processing apparatus 210 may re-set a set-up point of time for the integrated loudness level according to specific requirements.

Next, the first audio signal processing apparatus 210 may generate the loudness metadata based on the loudness information. For example, the first audio signal processing apparatus 210 may remove unnecessary information from the loudness information and generate loudness metadata in the form of a syntax which the second audio signal processing apparatus 220 may understand. Additionally, the first audio signal processing apparatus 210 may generate loudness metadata including additional information related to the input audio signal. The additional information related to the input audio signal may include at least one of information representing each of the length, genre, content provider, content creator, popularity, number of views, album, and channel of the input audio signal. As a result, the first audio signal processing apparatus 210 enables another device which outputs the input audio signal to adjust the output loudness level of the input audio signal by using the additional information.

For example, the input audio signal may be a sound source of the same content creator of a previously played-back audio signal. In this case, the input audio signal and the previously played-back audio signal may have similar sound characteristics, such as style/tone. Accordingly, an apparatus for outputting the input audio signal (for example, the second audio signal processing apparatus 220) may determine the loudness gain of the input audio signal based on the target loudness level of the previously played-back audio signal. In this case, the second audio signal processing apparatus 220 may be used for the loudness metadata including the additional information.

Next, the loudness metadata generated by the first audio signal processing apparatus 210 may be stored in a metadata database (hereinafter, 'DB'). The first audio signal processing apparatus 210 may receive a request for the loudness metadata of an input audio signal from the second audio signal processing apparatus 220. In this case, the first audio signal processing apparatus 210 may transmit the loudness metadata of the corresponding input audio signal to the second audio signal processing apparatus 220.

The second audio signal processing apparatus 220 according to an embodiment of the present invention may acquire the loudness information of the input audio signal from the first audio signal processing apparatus 210. Specifically, the second audio signal processing apparatus 220 may request the loudness metadata of the input audio signal from the first audio signal processing apparatus 210. In addition, the second audio signal processing apparatus 220 may receive the loudness metadata of the input audio signal from the first audio signal processing apparatus 210. The second audio signal processing apparatus 220 may acquire the loudness information of the input audio signal based on the received loudness metadata.

The second audio signal processing apparatus 220 may acquire a loudness gain applied to the input content based on the loudness information. Specifically, the second audio signal processing apparatus 220 may acquire a loudness gain based on the loudness information and a target loudness level. According to an embodiment, the second audio signal processing apparatus 220 may acquire a loudness gain applied to a specific frame of the input content. A loudness gain applied for each frame in some specific sections of the input content may be dynamically adjusted over time. A loudness gain applied for each frame in the rest of the sections other than the specific sections may be a static gain not dynamically adjusted. In addition, the loudness gain in some specific sections of the input content may be limited to a value within a specific range.

Next, the second audio signal processing apparatus 220 may adjust the output loudness level of the input content based on the loudness gain. For example, the second audio signal processing apparatus 220 may adjust the output loudness level by applying the loudness gain to the input content. According to an embodiment, the loudness gain may be applied to each frame constituting the input content. In this case, the second audio signal processing apparatus 220 may adjust the output loudness level of the input content by multiplying an audio signal corresponding to each frame by the loudness gain. The second audio signal processing apparatus 220 may acquire output content whose output loudness level is adjusted by the loudness gain from the input content. In addition, the second audio signal processing apparatus 220 may output the acquired output content. For example, the second audio signal processing apparatus 220 may play back the output content. Alternatively, the second audio signal processing apparatus 220 may transmit the output content to a playback device through a wired/wireless interface.

Additionally, the second audio signal processing apparatus 220 may control the dynamic range of the adjusted output loudness level. This is because, when an output loudness level for a specific frame of the input content is out of a predetermined dynamic range, sound quality distortion caused by clipping may occur. The second audio signal processing apparatus 220 may control the dynamic range of an output loudness level based on the predetermined dynamic range. For example, the second audio signal processing apparatus 200 may control the dynamic range of an output loudness level using processing such as a limiter and a Dynamic Range Compressor (DRC).

Figure 3:
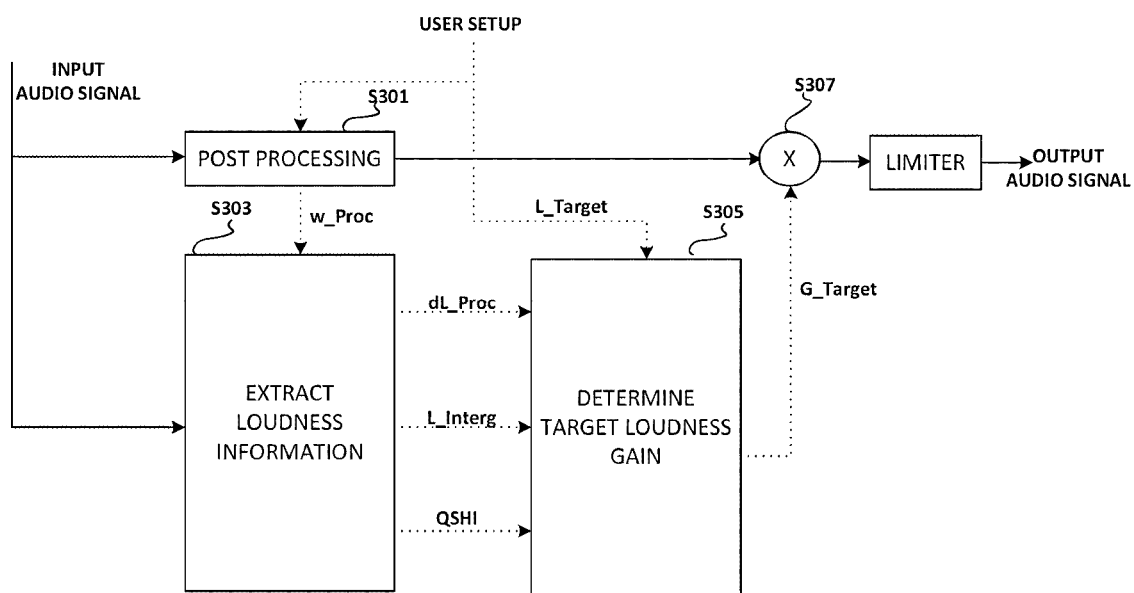
FIG. 3 is a flow chart showing a method for adjusting the loudness level of an input audio signal according to an embodiment of the present invention.

FIG. 3 is a flow chart showing a method for adjusting the loudness level of an input audio signal according to an embodiment of the present invention. For convenience of description, in FIG. 3, a series of operations for adjusting the output loudness level of an input audio signal is are described as being performed by a single audio signal processing apparatus, but the present disclosure is not limited thereto. For example, some of the operations described with reference to FIG. 3 may be performed by a server, and the rest thereof may be performed by a client.

In Step S301 of FIG. 3, an audio signal processing apparatus may perform a post-processing operation on an input audio signal. For example, the audio signal processing apparatus may perform at least one operation of equalization or a sound field mode for the input audio signal. In this case, the equalization and the sound field mode performed by the audio signal processing apparatus may be an operation of a typical media playback system.

In Step S303, the audio signal processing apparatus may extract loudness information of the input audio signal. According to an embodiment, when Step S301 is performed, in Step S303, the audio signal processing apparatus may extract the loudness information based on frequency characteristics of post-processing. The audio signal processing apparatus may acquire loudness level information for each band (weight of post processing, w_Proc), which is changed by post-processing, based on the frequency characteristics of the post-processing. Also, the audio signal processing apparatus may extract the loudness information using the w_Proc.

For example, when the above-described equalization is performed on the input audio signal, the w_Proc may include equalization curve information in a corresponding frequency domain. The audio signal processing apparatus may extract the loudness information of the input audio signal based on the equalization curve information. When the above-described sound field mode is applied to the input audio signal, the w_Proc may include at least one of characteristic information or reverb information of a filter used in the corresponding sound field mode.

According to another embodiment, an environment in which the input audio signal is output may be an environment in which frequency characteristics are not uniform and a response to a low frequency is small, such as a small speaker used in a mobile phone. In this case, the w_Proc may include frequency characteristics information of the corresponding output environment. Finally, the audio signal processing apparatus may adjust the output loudness level of the input content based on the w_Proc. As a result, the audio signal processing apparatus may provide output loudness level adjustment reflecting the characteristics of a device from which the input audio signal is output.

According to an embodiment of the present disclosure, the loudness information extracted in Step S303 may include at least one of Integrated Loudness L_Integ, Quality Secure Histogram Index QSHI, or a difference in loudness by post-processing dL_Proc. In this case, the L_Integ may follow ITU-R BS. 1770-4 standard specifications. In addition, the QSHI may represent a threshold loudness level at which cognitive sound quality damage caused by an output terminal limiter does not occur. In the present disclosure, the QSHI may include a maximum target loudness Max TL. The QSHI may be calculated based on an automatic algorithm or defined by a content creator. A detailed method for acquiring the QSHI will be described later with reference to FIG. 4. In addition, the dL_Proc may be a predicted value for the change in loudness of the input audio signal after the post-processing. The audio signal processing apparatus may acquire the dL_Proc based on post-processing information set by a user. The audio signal processing apparatus may acquire the dL_Proc based on at least one of the characteristics of the input audio signal for each frequency or the w_Proc.

In Step S305, the audio signal processing apparatus may determine a loudness gain G_target of the input audio signal. For example, the audio signal processing apparatus may determine the loudness gain G_target based on a predetermined target loudness level L_target and the loudness information extracted in Step S303. In this case, the predetermined target loudness level may be a value set by the user. In Step S307, the audio signal processing apparatus may output an output audio signal by applying a final loudness gain to the input audio signal post-processed in Step S301.

In this case, the output audio signal may be a signal passed through a limiter. The audio signal processing apparatus may output a first output audio signal by applying the final loudness gain to the input audio signal post-processed. In addition, the audio signal processing apparatus may generate a second output audio signal by applying a limiter to the first output audio signal. Finally, the audio signal processing apparatus may output the second output audio signal to which the limiter is applied.

Figure 4:
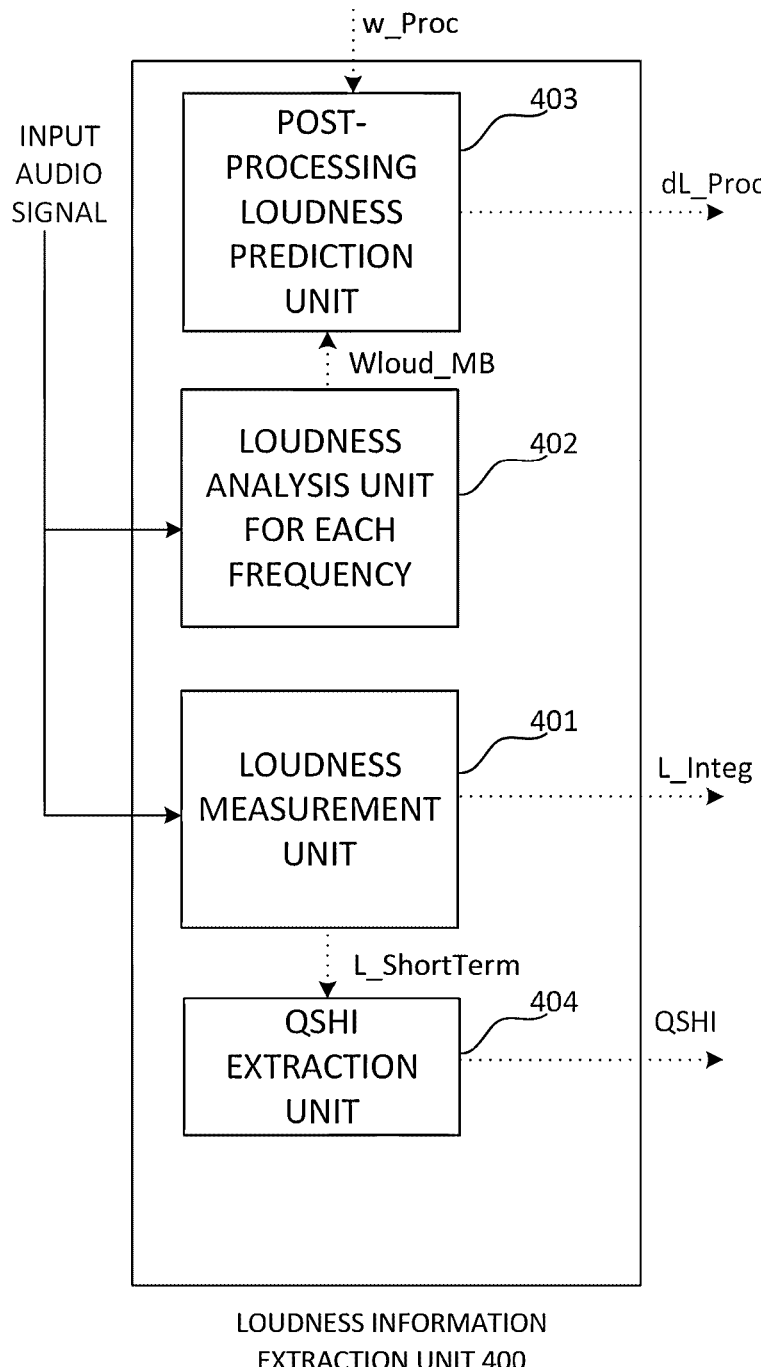
FIG. 4 is a block diagram specifically showing a method by which an audio signal processing apparatus extracts loudness information of an input audio signal according to an embodiment of the present invention.

Hereinafter, a method by which an audio signal processing apparatus extracts loudness information will be described in detail with reference to FIG. 4. FIG. 4 is a block diagram specifically showing a method by which an audio signal processing apparatus extracts loudness information of an input audio signal according to an embodiment of the present invention. For convenience of description, in FIG. 14, each unit/part is described as performing each operation. However, the present disclosure is not limited thereto. For example, operations of each unit/part of a loudness information extraction unit 400 in FIG. 4 may be a series of operations performed by a processor included in an audio signal processing apparatus.

Referring to FIG. 4, the loudness information extraction unit 400 may include a loudness measurement unit 401, a loudness analysis unit for each frequency 402, a post-processing loudness prediction unit 403, and a QSHI extraction unit 404. The loudness information extraction unit 400 may performed the operations described with reference to Step S303 of FIG. 3.

According to an embodiment, the loudness measurement unit 401 may acquire a loudness measurement value of an input audio signal. For example, the loudness measurement unit 401 may acquire at least one of a short-term loudness level of the input audio signal or an integrated loudness level of the same. Specifically, the loudness measurement unit 401 may acquire, through a process as in the example of the standard specification ITU-R BS. 1770-4, the integrated loudness information L_Integ and short-term loudness information L_ShortTerm from the input audio signal.

According to an embodiment, the loudness analysis unit for each frequency 402 may acquire a loudness ratio for each frequency of the entire input audio signal (Multi-band Weight in loudness, WLoud_MB). For example, the loudness analysis unit for each frequency 402 may acquire th WLoud_MB by applying a k-weighting filter to the input audio signal. The loudness analysis unit for each frequency 402 may calculate the WLoud_MB by converting the frequency of a signal to which the k-weighting filter has been applied.

Hereinafter, referring to Equation 1 to Equation 8, a detailed method by which the loudness analysis unit for each frequency 402 calculates the WLoud_MB will be described.

$$x\_k = \text{filter}(h\_k\text{weight}, x\_in),$$

or $$x\_k = \text{filter}(h\_pre2\_k\text{weight}, \text{filter}(h\_pre1\_k\text{weight}, x\_in)) \quad \text{[Equation 1]}$$

Figure 5:
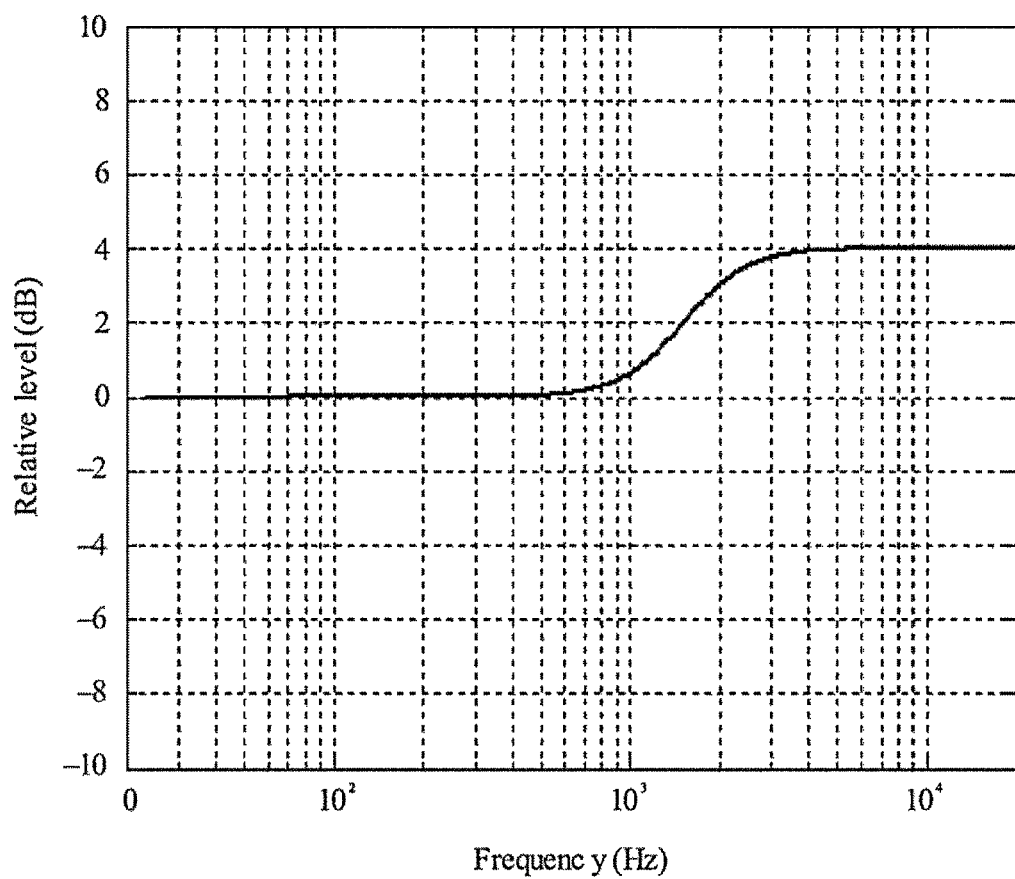
FIG. 5 shows a frequency response of a primary pre-filter defined in ITU-R BS.1770-4.
Figure 6:
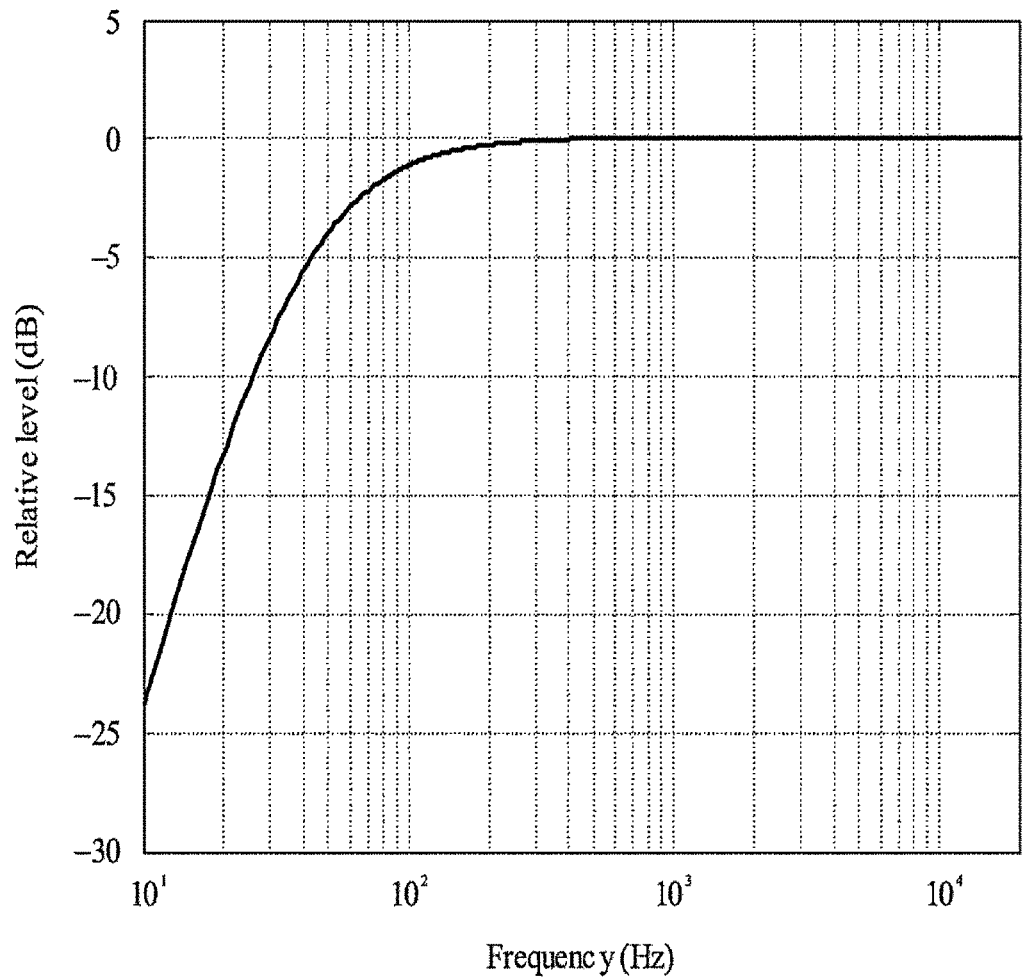
FIG. 6 shows a frequency response of a secondary pre-filter.

In Equation 1, x_k represents a signal to which the k-weighting filter has been applied for an input audio signal x_in. In Equation 1, "filter(A,B)" represents an operation of filtering an input audio signal B with a filter coefficient A. In Equation 1, h_kweight may represent a single k-weighting filter. In addition, each of h_pre2_kweight and h_pre1_kweight may represent a primary pre-filter and a secondary pre-filter defined in ITU-R BS.1770-4. The loudness analysis unit for each frequency 402 may filter and then apply a k-weighting filter coefficient to an input audio signal. FIG. 5 shows a frequency response of the primary pre-filter defined in ITU-R B S.1770-4. In addition, FIG. 6 shows a frequency response of the secondary pre-filter.

A signal by frame of the signal x_k obtained through Equation 1 may be expressed as in Equation 2. In Equation 2, x_frame[1] represents a signal of an i-th frame of the signal x_k. Here, NF may represent the length of a frame, and NH may represent a hop size.

$$x\_\text{frame}[1] = x\_k[((1-1)*NH+1):((1-1)*NH+NF)] \quad \text{[Equation 2]}$$

Next, referring to Equation 3, the loudness analysis unit for each frequency 402 may acquire xw_frame[1][–] by windowing x_frame[1]. In this case, the loudness analysis unit for each frequency 402 may acquire xw_frame[1][–] by using a rectangular window function in which all coefficients of a window function are 1. Alternatively, the loudness analysis unit for each frequency 402 may acquire xw_frame[1][–] by using various window functions such as a hamming window function or a hanning window function. The windowing may be an operation for the frequency analysis of an input audio signal. In Equation 3, wind[n] represents an n-th coefficient of a window function, and n may be a sample number of a window. For example, when NF is 512, the value of n may be any one of 1 to 512.

$$xw\_\text{frame}[1][n] = x\_\text{frame}[1][n]*\text{wind}[n] \text{ for } n=1,2,\ldots,NF \quad \text{[Equation 3]}$$

In addition, the loudness analysis unit for each frequency 402 may perform Discrete Fourier Transform (DFT) on xw_frame[1][–]. A frequency domain signal XW_frame[1], which is Discrete Fourier Transformed from xw_frame[1][–] may be expressed as in Equation 4. In Equation 4, DFT{x} represents the Discrete Fourier Transform of a signal 'x' in a time domain.

$$XW\_\text{frame}[1] = \text{DFT}\{xw\_\text{frame}[1][1:NF]\} \quad \text{[Equation 4]}$$

Next, referring to Equation 5, the loudness analysis unit for each frequency 402 may acquire a power for each frequency bin of the transformed frequency signal XW_frame [1]. In Equation 5, P_frame_bin[l][k] represents a power in a k-th frequency bin of the i-th frame. In addition, conj(x) represents a conjugation function of the 'x.'

$$P\_\text{frame\_bin}[1][k] = XW\_\text{frame}[1][k]*\text{conj}(XW\_\text{frame}[1][k]) \text{ for } k=1,2,\ldots,NF \quad \text{[Equation 5]}$$

Next, referring to Equation 6, the loudness analysis unit for each frequency 402 may acquire a power for each frequency band of the i-th frame P_frame_band[1][b] by mapping P_frame_bin[l][k] to a predetermined frequency band. In Equation 6, band[b] represents an index of a starting frequency bin of a b-frequency band. That is, the loudness analysis unit for each frequency 402 may acquire the power for each frequency band by adding powers for each frequency bin from the band[b] to a band[b+1]–1. In Equation 6, sum_{y} (x) may represent a sum for each index of a function 'x' having an index k as a factor. In this case, 'y' may represent the range of an index for the corresponding operation.

$$P\_\text{frame\_band}[1][b] = \text{sum}\{k \text{ from band}[b] \text{ to band}[b+1]-1\}(P\_\text{frame\_bin}[1][k]) \quad \text{[Equation 6]}$$

Referring to Equation 7, the loudness analysis unit for each frequency 402 may acquire a power for each frequency band of the entire section of the input audio signal P_band[b] based on the power for each frequency band of the i-th frame P_frame_band[1][b]. The loudness analysis unit for each frequency 402 may acquire the power for each frequency band of the entire section of the input audio signal P_band[b] by addling powers for each frequency band P_frame_band[1][b] acquired for each frame by the same frequency band. In Equation 7, NumberOfFrames represents the total number of frames. In addition, I, which represents a frame index, is defined within the range of 1 to NumberOfFrames.

$$P\_\text{band}[b] = \text{sum}\_\{1 \text{ from } 1 \text{ to NumberOfFrames}\}(P\_\text{frame\_band}[1][b]) \quad \text{[Equation 7]}$$

Next, referring to Equation 8, the loudness analysis unit for each frequency 402 may acquire a loudness ratio for each frequency band WLoud_MB [b] based on the power for each frequency band P_band[b]. Specifically, the loudness analysis unit for each frequency 402 may normalize the power for each specific frequency band P_band[b] based on the sum of each power for each frequency band. In Equation 8, NumberOfBands represents the total number of divided frequency bands. In addition, B which represents a band index, is defined within the range of 1 to NumberOfBands.

$$WLoud\_MB[b]=P\_band[b]/[sum\_\{b \text{ from 1 to NumberOfBands}\}(P\_band[b])] \quad \text{[Equation 8]}$$

WLoud_MB [b] calculated by Equation 8 represents the ratio of the integrated loudness level for each frequency band of the input audio signal. For example, the input audio signal may be a 2-band signal, the integrated loudness level of the input audio signal may be L_Integ=−20 LKFS, and WLoud_MB[10]=0.8 and WLoud_MB[1]=0.2. In this case, the loudness level for a first frequency band of the input audio signal may be predicted to be −20+10*log 10(0.8)=−20.97 LKFS, and the loudness level for a second frequency band may be predicted to be −20+10*log 10(0.2)=−26.99 LKFS.

According to an embodiment, the post-processing loudness prediction unit 403 may acquire a difference in loudness by post-processing based on at least one of the loudness level information for each band w_Proc which is changed by post-processing or the loudness ratio for each frequency of the entire input audio signal WLoud_MB.

In this case, the post-processing loudness prediction unit 403 may use the loudness ratio for each frequency of the entire input audio signal WLoud_MB acquired through the loudness analysis unit for each frequency 402. In addition, the loudness level information for each band w_Proc which is changed by post-processing may be acquired according to the characteristics of the post-processing for the input audio signal. The characteristics of the post-processing for the input audio signal may be determined based on information inputted by a user.

Specifically, equalization set by the user may be applied, a gain for each frequency band of the corresponding equalization may be set to w_ProcBand_dB in decibel units for each of NumberOfBands frequency bands, and the total gain of the corresponding equalization may be set to w_Proc-Gain_dB. In this case, the loudness analysis unit for each frequency 402 may acquire the loudness ratio for each frequency band WLoud_MB[b] based on the gain for each frequency band w_ProcBand_dB and the total gain w_Proc-Gain_dB. A method by which the loudness analysis unit for each frequency 402 calculates a loudness ratio for each frequency band may be represented as in Equation 9.

$$w\_Proc[b]=10^{((w\_ProcBand\_dB[b]+0.5*w\_Proc-Gain\_dB)/10)} \quad \text{[Equation 9]}$$

for 1=<b=<NumberOfBands

In addition, a method by which the post-processing loudness prediction unit 403 acquires the difference in loudness by post-processing dL_Proc may be represented as in Equation 10.

$$dL\_Proc=10*\log 10(sum\_\{b \text{ from 1 to NumberOfBands}\}(WLoud\_MB[b]*w\_Proc[b])) \quad \text{[Equation 10]}$$

According to an embodiment, the QSHI extraction unit 404 may extract a Quality Secure Histogram Index (QSHI) based on the short-term loudness information L_ShortTerm. As described above, the Quality Secure Histogram Index (hereinafter, QSHI) may be a threshold loudness level at which cognitive sound quality damage does not occur. The QSHI extraction unit 404 may acquire the QSHI based on the short-term loudness information L_ShortTerm acquired by the loudness measurement unit 401.

For example, the QSHI extraction unit 404 may acquire the QSHI by analyzing the short-term loudness information L_ShortTerm. In this case, the short-term loudness information L_ShortTerm may include one or more short-term loudness levels of the input audio signal. Specifically, the QSHI extraction unit 404 may acquire a histogram for each short-term loudness magnitude of the input audio signal based on one or more short-term loudness levels. In addition, the QSHI extraction unit 404 may acquire the QSHI of the input audio signal based on the acquired histogram for each short-term loudness magnitude.

Hereinafter, referring to Equation 11 and Equation 12, a detailed method by which the QSHI extraction unit 404 extracts a QSHI from the short-term loudness information L_ShortTerm of an input audio signal will be described. In Equation 11, L_ShortTerm_Sorted represents information in which one or more short-term loudness levels are arranged in the order of magnitude, the levels included in the short-term loudness information L_ShortTerm of the input audio signal. For example, the QSHI extraction unit 404 may arrange one or more short-term loudness levels in 'descending' order.

$$L\_ShortTerm\_Sorted=sort(L\_ShortTerm,\text{'descending'}) \quad \text{[Equation 11]}$$

In addition, the QSHI extraction unit 404 may acquire a loudness level corresponding to a predetermined index among one or more short-term loudness levels of the input audio signal based on the L_ShortTerm_Sorted. In Equation 12, EffectiveIndex may represent a predetermined effective index. Specifically, the predetermined effective index EffectiveIndex may indicate short-term loudness levels in a predetermined order of magnitude among one or more short-term loudness levels of the input audio signal. That is, the QSHI extraction unit 404 may acquire an EffectiveIndex-th largest short-term loudness level among one or more short-term loudness levels of the input audio signal. In this case, the EffectiveIndex-th largest short-term loudness level among one or more short-term loudness levels of the input audio signal may be referred to as an effective short-term loudness level L_ShortTerm_Effective of the input audio signal.

$$L\_ShortTerm\_Effective=L\_ShortTerm\_Sorted[EffectiveIndex] \quad \text{[Equation 12]}$$

Next, the QSHI extraction unit 404 may acquire a QSHI based on at least one of the effective short-term loudness level L_ShortTerm_Effective of the input audio signal or the integrated loudness level. In addition, the QSHI may be a value greater than or equal to the integrated loudness level.

Additionally, the QSHI extraction unit 404 may acquire an effective short-term loudness level L_ShortTerm_Effective_Shift to be changed when the input audio signal is output according to the predetermined target loudness level. Specifically, the QSHI extraction unit 404 may predict short-term loudness information L_ShortTerm_Shft to be changed based on the short-term loudness information L_ShortTerm of the input audio signal. In this case, the short-term loudness information L_ShortTerm_Shft may include one or more short-term loudness levels to be changed when the input audio signal is output according to the predetermined target loudness level. In this case, the QSHI extraction unit 404 may acquire a QSHI based on the acquired L_ShortTerm_Effective_Shift. For example, the QSHI may be the maximum target loudness when the L_ShortTerm_Effective_Shift [EffectiveIndex] is limited to be less than or equal to the threshold value of the short-term loudness level.

For example, the L_ShortTerm_Effective_Shift of the input audio signal may be used as a short-term loudness level threshold value L_Threshold. The QSHI extraction unit 404 may correct the maximum target loudness based on the L_ShortTerm_Effective_Shift. The QSHI extraction unit 404 may use the corrected maximum target loudness as a QSHI value. Alternatively, the QSHI extraction unit 404 may select a greater value of the maximum target loudness adjusted as described above and the integrated loudness of the input audio signal as the QSHI value.

Through the above method, the audio signal processing apparatus may relatively effectively prevent the sound quality deterioration of the input audio signal by a limiter. This is because, in the entire section of the input audio signal, the sound quality may be deteriorated by a limiter in a portion in which the volume is set relatively high.

According to an embodiment, the QSHI may be a value set such that the number of short-term loudness levels greater than a specific value among one or more short-term loudness levels of the input audio signal is smaller than the EffectiveIndex. In this case, the EffectiveIndex may be a value determined based on the characteristics of a limiter of the audio signal processing apparatus. For example, the EffectiveIndex may be changed according to the degree of sound quality deterioration caused by operations of a limiter. Additionally, the short-term loudness threshold value L_Threshold may be a value determined based on the characteristics of a limiter of the audio signal processing apparatus. For example, the short-term loudness threshold value L_Threshold may be changed according to the degree of sound quality deterioration caused by operations of a limiter.

According to a specific embodiment, the input audio signal may have a relatively large dynamic range. For example, the integrated loudness level of the input audio signal may be L_Integ=−24LKFS, and the effective short-term loudness level may be extracted as L_ShortTerm_Effective=−10LKFS. In this case, when the EffectiveIndex=10 and the short-term loudness threshold value=−7LKFS, the QSHI may be calculated as −21LKFS.

In the above-described embodiment, the method in which the QSHI of the input audio signal is extracted based on the histogram for each short-term loudness magnitude has been described, but the present disclosure is not limited thereto. For example, the QSHI of the input audio signal may be defined as a value arbitrarily set by a creator of content including the input audio signal or by an operator of a sound system outputting the input audio signal. In addition, the audio signal processing apparatus may acquire the QSHI by performing histogram analysis on at least one of a peak envelope of the input audio signal or a RMS of the same in addition to the short-term loudness level.

According to an embodiment, the QSHI of the input audio signal may vary depending on the change in the histogram for each short-term loudness magnitude. For example, the above-described histogram for each short-term loudness magnitude may vary depending on whether or not there is post-processing determined according to a user's input. In this case, the QSHI of the input audio signal may be changed to a different value based on a predetermined table. Alternatively, the QSHI of the input audio signal may be changed to a value calculated based on the characteristics of post-processing.

Additionally, a method by which an audio signal processing apparatus according to an embodiment of the present disclosure determines a loudness gain of an input audio signal based on the above-described loudness information will be described. Equation 13 represents a changed integrated loudness level L_IntegProc of an input audio signal when a post-processing process is performed on the input audio signal. The audio signal processing apparatus may acquire the changed integrated loudness level L_IntegProc of an input audio signal based on the difference in loudness by post-processing dL_Proc. Referring to Equation 13, the audio signal processing apparatus may acquire the changed integrated loudness level L_IntegProc by adding the difference in loudness by post-processing dL_Proc to the integrated loudness level L_IntegProc of the input audio signal.

$$L\_IntegProc = L\_Integ + dL\_Proc \qquad \text{[Equation 13]}$$

The audio signal processing apparatus may calculate a loudness gain for adjusting an output loudness level based on the above-described QSHI, the predetermined target loudness level L_Target, and the integrated loudness level changed by post-processing.

In the above-described embodiment, the target loudness level L_Target may be a value set by a user. However, the present disclosure is not limited thereto. For example, the predetermined target loudness level L_Target may be a default value provided from a playback system which outputs the input audio signal. Alternatively, the predetermined target loudness level L_Target may be a value set based on a playback environment in which the input audio signal is output. The audio signal processing apparatus may apply the loudness gain G_Target to a first intermediate audio signal post-processed from the input audio signal. For a practical implementation reason, a post-processing process may be performed after the input audio signal before post-processing is multiplied by the loudness gain G Target. In addition, the audio signal processing apparatus may output a second intermediate audio signal, to which the loudness gain G_Target is applied, through a limiter.

Meanwhile, a multimedia streaming service is a method widely used in the current media market. A system which provides the multimedia streaming service may be generally composed of a server for storing content to be streamed and a user device (that is, a client). In this case, on the client side, the multimedia streaming service may be provided in the form of playback within an application or the web. Each of the server and the client may be an audio signal processing apparatus which performs operations described in the present disclosure. In such a server-client structure, the server may provide loudness information by performing input content analysis. Also, the client may adjust the output loudness level of the input content based on the loudness information provided from the server. Specifically, the server may transmit loudness metadata including the loudness information of an input audio signal to the client. The client may receive the loudness metadata of the input audio signal from the server. In addition, the client may acquire a loudness gain applied to the input audio signal based on the loudness metadata of the input audio signal.

Figure 7:
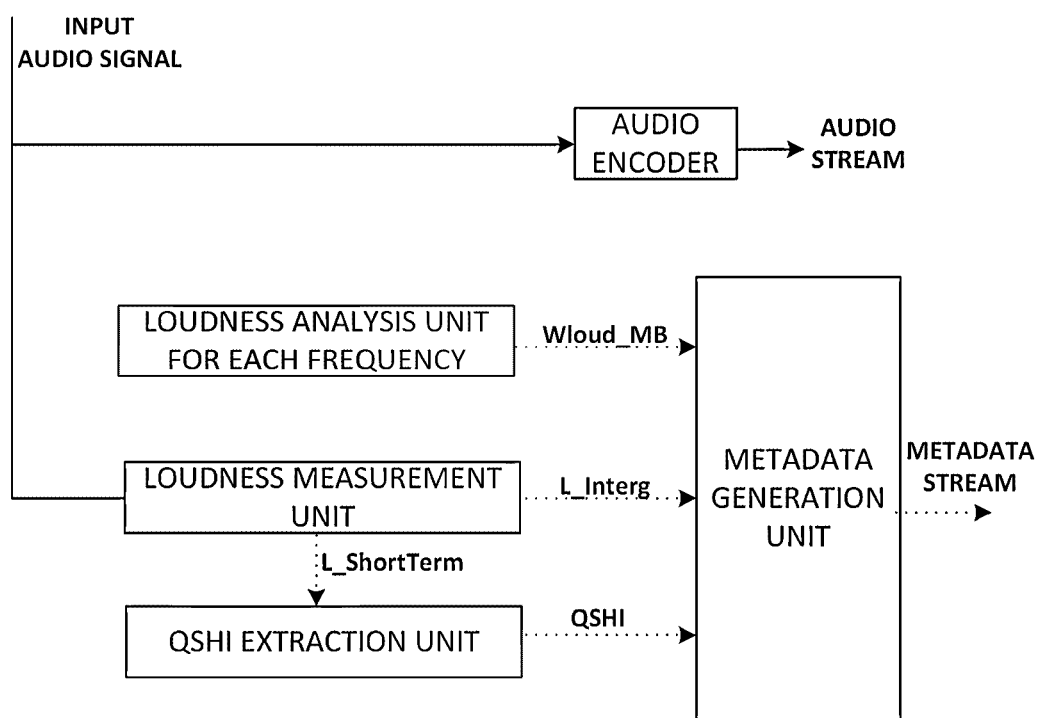
FIG. 7 is a view showing a method by which a server according to an embodiment of the present invention generates loudness metadata of an input audio signal.

FIG. 7 is a view showing a method by which a server according to an embodiment of the present invention generates loudness metadata of an input audio signal. The server according to an embodiment of the present invention may generate and/or output an audio stream by encoding the input audio signal. The server according to an embodiment of the present invention may extract the loudness information of the input audio signal. For example, the server of FIG. 7 may perform the operations described with reference to the loudness information extraction step Step S303 of FIG. 3 and the operations described with reference to the loudness information extraction unit 400 of FIG. 4. In addition, the server may generator loudness metadata including the extracted loudness information. The server may output the generated loudness metadata to an external device. For example, the server may transmit the generated loudness metadata to the client in the form of a metadata stream.

Figure 8:
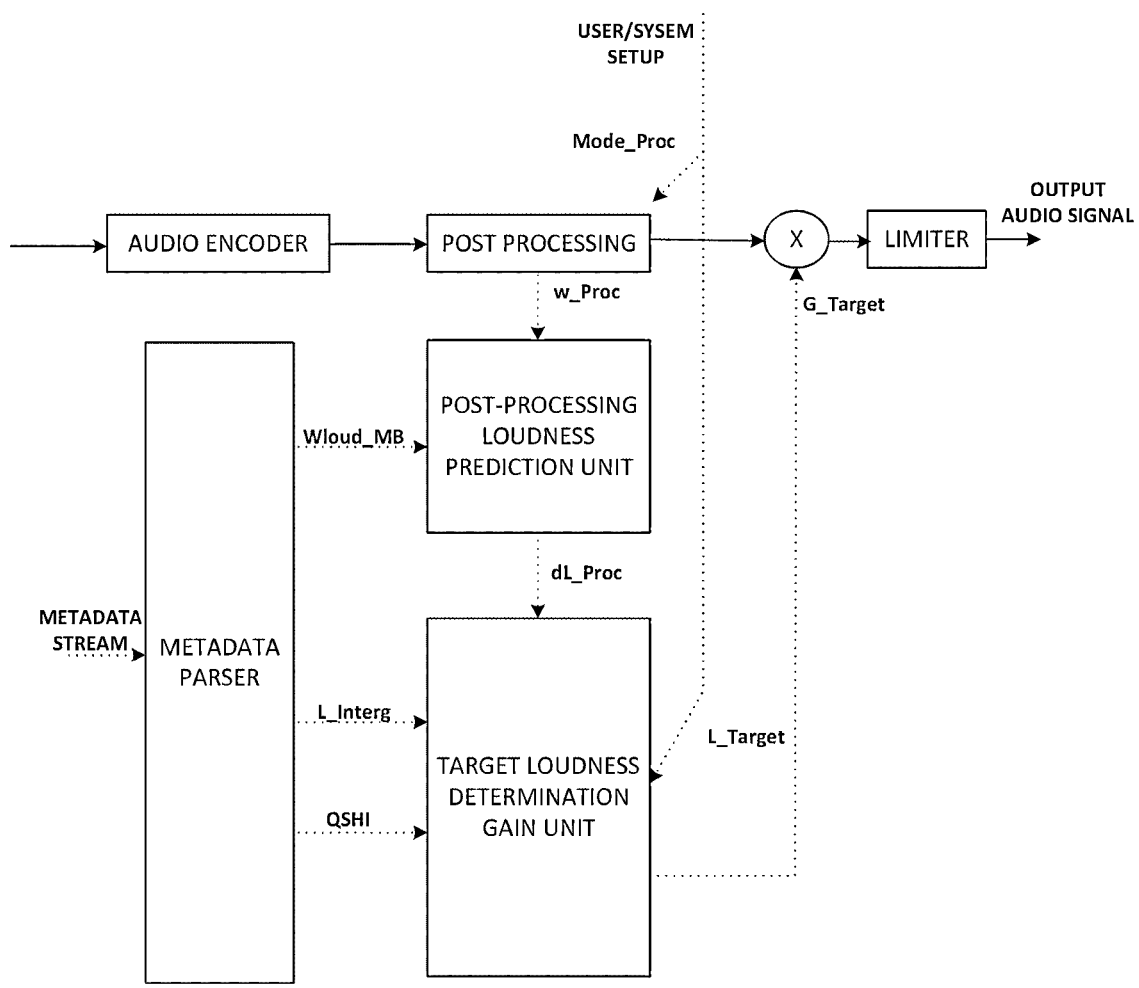
FIG. 8 is a view showing a method by which a client according to an embodiment of the present invention outputs an input audio signal using loudness metadata.

FIG. 8 is a view showing a method by which a client according to an embodiment of the present invention outputs an input audio signal using loudness metadata. The client according to an embodiment of the present invention may receive an audio stream. In addition, the client may acquire an input audio signal by decoding the received audio stream. The client can perform a post-processing process on the input audio signal. In this case, whether or not the post-processing process is performed and the characteristics thereof may be determined based on an input received from a user or a predetermined value stored in a system.

The client according to an embodiment of the present invention may determine a loudness gain of the input audio signal based on loudness metadata of the input audio signal. For example, the client may receive loudness metadata in the form of a metadata stream. The client may acquire loudness information of the input audio signal by parsing the loudness metadata of the input audio signal. Specifically, the client may acquire at least one of the WLoud_MB, the L_Integ, and the QSHI described above with reference to FIG. 3 and FIG. 4 from the loudness metadata of the input audio signal. The client may determine the loudness gain of the input audio signal based on the acquired loudness information. The client may adjust an output loudness level by applying the loudness gain to the input audio signal. The client may generate an output audio signal by applying a limiter to an intermediate audio signal whose output loudness level has been adjusted. In addition, the client may output the output audio signal.

According to according to an embodiment, the client of FIG. 8 may perform the operations described with reference to the post-processing Step S301. the loudness gain determination Step S305, the loudness gain application Step S307 of FIG. 3 and the operations described with reference to the post-processing loudness prediction unit 403 of FIG. 4.

Meanwhile, music content may have a variety of loudness according to the age and/or genre of the content. For example, the integrated loudness level of classical music is relatively low in order to provide a wide dynamic range, whereas the integrated loudness level of pop music of the 2000s is relatively large. Specifically, the integrated loudness level of the pop music of the 2000s may be about −13 to about −8 LKFS, and the integrated loudness level of a quiet movement in a classical music piece may be about −30 LKFS.

In determining a target loudness level, −23 to −24LKFS defined as a broadcasting standard may be used. However, this may not provide sufficient volume with respect to external noise in a noisy environment such as in the subway. Accordingly, the audio signal processing apparatus according to an embodiment of the present invention may determine different target loudness levels depending on a playback environment. When the target loudness level of the pop music of the 2000s is set to −10, the volume of the pop music of the 2000s may not change significantly. On the other hand, when music such as classical music or music of the 1970s to 1980s having a relatively low integrated loudness level is set to −10, the change in volume may be large.

Figure 9:
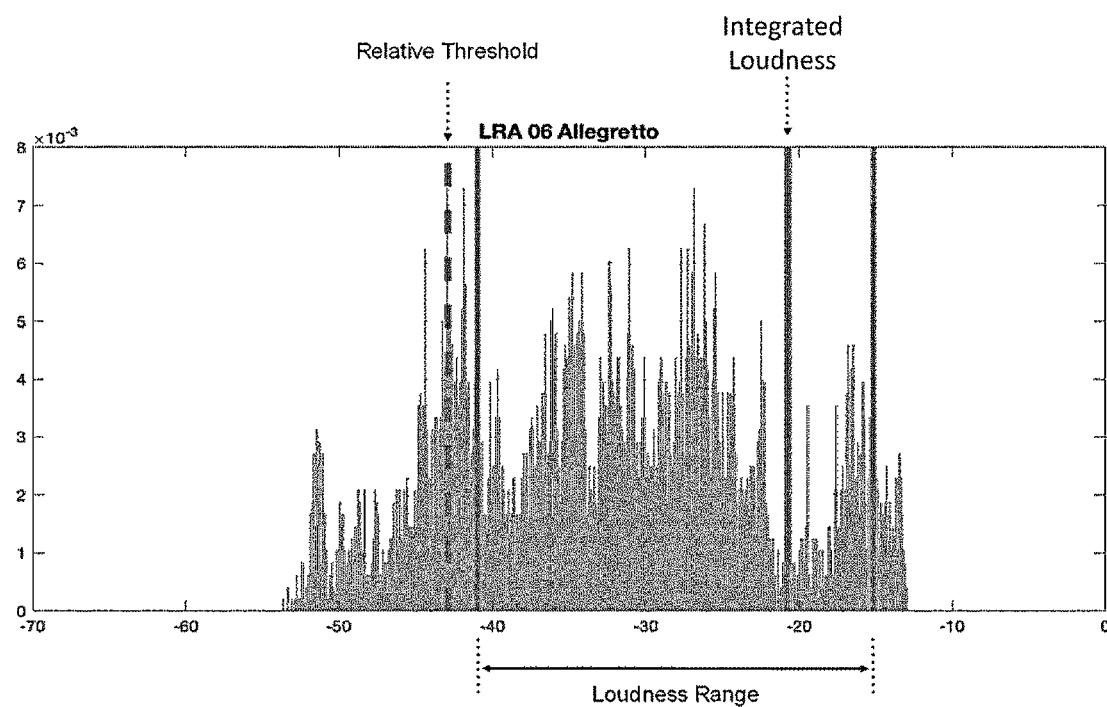
FIG. 9 is a view showing a histogram for each short-term loudness magnitude of an input audio signal according to an embodiment of the present invention.

FIG. 9 is a view showing a histogram for each short-term loudness magnitude of an input audio signal according to an embodiment of the present invention. In the embodiment described with reference to FIG. 9, the genre of the input audio signal may be classical music. In addition, in the embodiment described with reference to FIG. 9, the integrated loudness of the input audio signal may be about −21 LKFS. For example, the target loudness level of the corresponding input audio signal may be L_Target=−10 LKFS. In this case, the histogram for each short-term loudness magnitude is moved to the right by +11 LKFS. In this case, a section having a short-term loudness level greater than −7 LKFS is generated.

According to an embodiment, in the section having a short-term loudness level greater than −7 LKFS, sound quality deterioration caused by a limiter may occur. Accordingly, the audio signal processing apparatus according to an embodiment of the present invention may perform loudness normalization of the input audio signal based on a QSHI as described above. In this case, although the performance of loudness normalization performance may be relatively reduced, a best-effort method may be used to best-align to prevent damage to sound quality.

According to an embodiment of the present invention, the audio signal processing apparatus may use a loudness gain correction method to be as close as possible to a target loudness level based on loudness information of an input audio signal. The audio signal processing apparatus may use the corresponding method to provide equalization in which a loudness level does not change.

The equalization is to adjust energy for each frequency of the input audio signal so that a tone desired by a user is obtained. In this case, the overall energy may increase depending on the degree of adjustment of the input audio signal. In this case, the input audio signal may be clipped. In addition, a limiter may cause damage to sound quality with respect to the input audio signal. Accordingly, the audio signal processing apparatus according to an embodiment of the present invention may set the target loudness level L_Target, the integrated loudness level L_Integ, and the QSHI, which are predetermined, to the same arbitrary value. In this case, the loudness gain G_Target of the input audio signal may be expressed as in Equation 14. That is, the audio signal processing apparatus may acquire a linear loudness gain G_Target. This is because the target loudness level L_Target, the integrated loudness level L_Integ, and the QSHI cancel each other.

$$G\_Target = \text{power}(10, -dL\_Proc)/20 \qquad \text{[Equation 14]}$$

The audio signal processing apparatus may apply the loudness gain G_Target of Equation 14 to an input audio signal. The audio signal processing apparatus may provide an output loudness level which is the same as the loudness level of the input audio signal by correcting the change in loudness caused by post-processing. The audio signal processing apparatus may maintain the loudness level of the input content by correcting the change in loudness caused by post-processing. The audio signal processing apparatus may set the loudness level of an intermediate audio signal to be the same as the loudness level of the input audio signal by using a difference in loudness by post-processing. In this case, the intermediate audio signal may be a signal post-processed from the input audio signal. This means that the audio signal processing apparatus changes the tone with respect to the input audio signal through post-processing, but provides the same loudness level as the original input audio signal. Meanwhile, the difference in loudness by post-processing may be acquired by the method described above with reference to FIG. 3 and FIG. 4. The difference in loudness by post-processing may be acquired based on a WLoud_MB provided through analysis or a WLoud_MB based on the characteristics of content.

Figure 10:
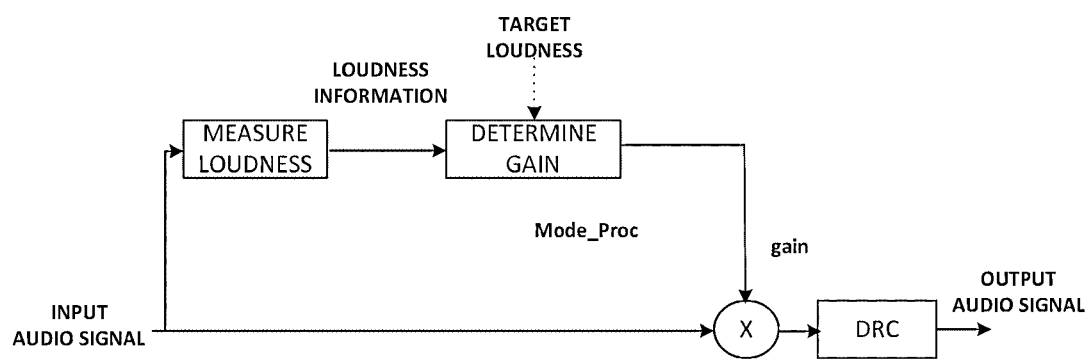
FIG. 10 is a block diagram showing a system in which an audio signal processing apparatus optimizes the loudness gain of an input audio signal in consideration of a target loudness level and cognitive sound quality deterioration according to an embodiment of the present invention.

FIG. 10 is a block diagram showing a system in which an audio signal processing apparatus optimizes the loudness gain of an input audio signal in consideration of a target loudness level and cognitive sound quality deterioration according to an embodiment of the present invention. The audio signal processing apparatus may determine a target loudness level acceptable to a dynamic processor based on the target loudness level and loudness information of the input audio signal. Here, the dynamic processor may represent a processing process in which a signal according to a loudness level, such as a limiter or a compressor described above, is clipped. The loudness information of the input audio signal may include at least one of an integrated loudness level, a short-term loudness level, a momentary loudness level, a sample peak, a true peak, a loudness range, or a root-mean-square (RMS).

Hereinafter, a detailed embodiment in which the audio signal processing apparatus determines the loudness gain of the input audio signal will be described. The maximum value of a target loudness level which may be set by a user according to an embodiment may be about −10LKFS, and the integrated loudness of the input audio signal may be about −22LKFS. In addition, the tenth short-term loudness level among a plurality of short-term loudness levels of the input audio signal may be about −18LKFS. In this case, the tenth short-term loudness level may be a detailed embodiment of the effective short-term loudness level L_ShortTerm_Effective described with reference to the QSHI extraction unit 404 of FIG. 4 described above. That is, −18LKFS may be used as an indicator to determine whether sound quality is deteriorated by a DRC. When the maximum value of a target loudness level is about −10LKFS, the maximum amplification amount may be about 12 Loudness Unit (LU). In this case, the audio signal processing apparatus may acquire a QSHI based on the tenth short-term loudness level amplified by the maximum amplification amount.

The audio signal processing apparatus may compare the predetermined target loudness level inputted by a user with the QSHI. The audio signal processing apparatus may determine the loudness gain of the input audio signal based on the comparison result. For example, the audio signal processing apparatus may determine the loudness gain of the input audio signal based on the smaller of the predetermined target loudness level inputted and the QSHI. In the above-described embodiment, in order to obtain an indicator to determine DRC sound quality deterioration, the tenth short-term loudness level from the top is selected when short-term loudness levels are arranged in descending order, but the present disclosure is not limited thereto. In addition, the audio signal processing apparatus may acquire the QSHI by performing histogram analysis on at least one of a peak envelope or a RMS in addition to the short-term loudness level.

Figure 11:
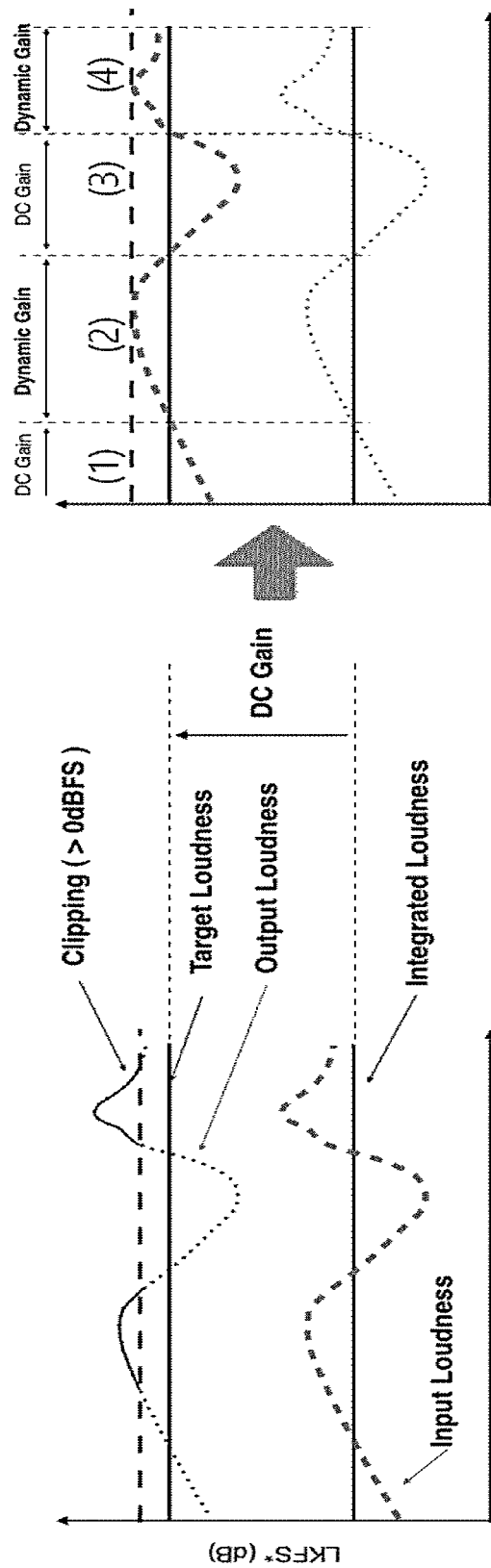
FIG. 11 and FIG. 12 are views showing a fixed gain for the loudness level and target loudness level of an input audio signal over time.
Figure 12:
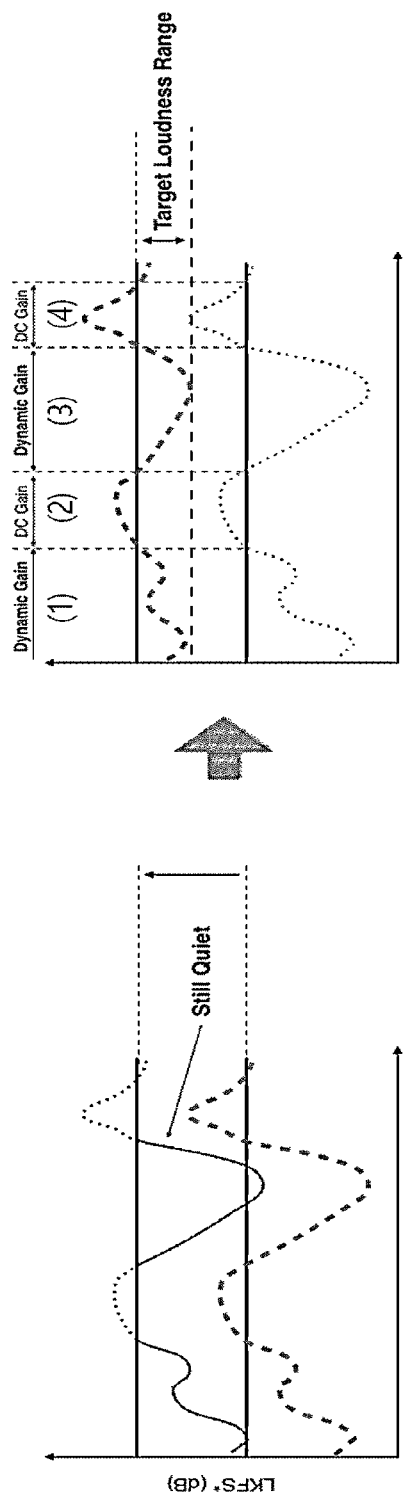

FIG. 11 and FIG. 12 are views showing a fixed gain for the loudness level and target loudness level of an input audio signal over time. FIG. 11 shows a fixed gain for adjusting the loudness level of a first input audio signal having a loudness distribution smaller than a target loudness level to the target loudness level. In this case, the first input audio signal is clipped in a section greater than 0dBFS so that excessive tone distortion may occur. As described above, in order to obtain a value close to the target loudness level, there is a limit to the loudness level adjustment method through the fixed gain. Accordingly, the audio signal processing apparatus may apply a gain smaller than a fixed gain value to Section (2) and Section (4) of the first input audio signal.

Referring to FIG. 12, a second input audio signal has a wider dynamic range than the first input audio signal of FIG. 11. Accordingly, when the audio signal processing apparatus applies a fixed gain for a target loudness level to the second input audio signal, the loudness level in some sections may be relatively small. Accordingly, the audio signal processing apparatus may apply a gain greater than a fixed gain value to Section (1) and Section (3) of the second input audio signal.

According to an additional embodiment, the audio signal processing apparatus may apply a gain boost. For example, the audio signal processing apparatus may acquire a target loudness range. The audio signal processing apparatus may set an additional gain for each section of the input audio signal based on the acquired target loudness range. Specifically, the audio signal processing apparatus may apply the set additional gain to a section having a loudness level out of the target loudness range among the entire section over time of the input audio signal.

As described above, the audio signal processing apparatus according to an embodiment of the present invention may adjust the output loudness level of an input audio signal by applying a different gain over time to the input audio signal. The audio signal processing apparatus may adjust the output loudness level of the input content based on loudness metadata of the input audio signal. In this case, the loudness metadata of the input audio signal may include information changing over time. In order to apply a different gain over time, the audio signal processing apparatus may refer to metadata different over time and normalize the output loudness level of the input audio signal according to a target loudness level and a target loudness range. As a result, in the present disclosure, the audio signal processing apparatus may solve the limitation as described above when compensating by applying a fixed gain to the input audio signal for loudness normalization.

Figure 13:
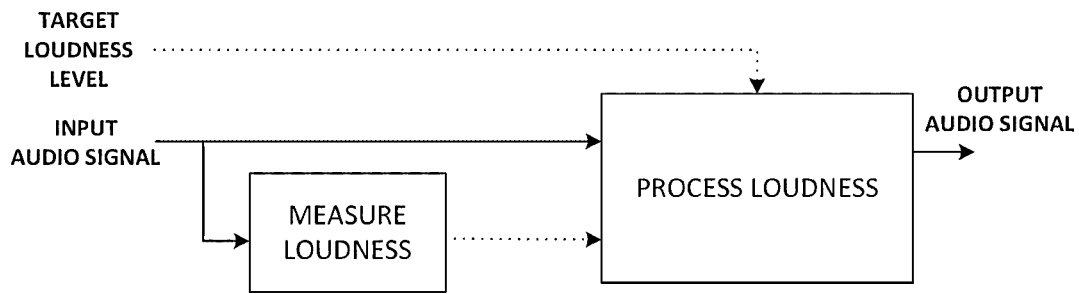
FIG. 13 and FIG. 14 are schematic views each showing a method for adjusting the output loudness level of an input audio signal according to an embodiment of the present invention.
Figure 14:
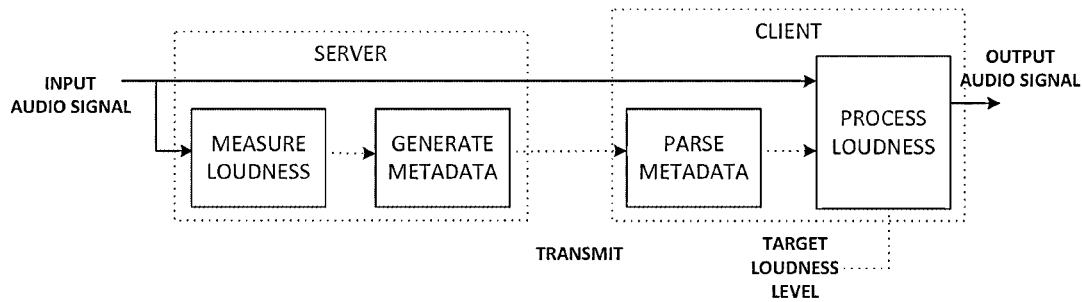

FIG. 13 and FIG. 14 are schematic views each showing a method for adjusting the output loudness level of an input audio signal according to an embodiment of the present invention. FIG. 13 shows an embodiment in which loudness information of an input audio signal is extracted and an output loudness level of the input audio signal is adjusted in a single audio signal processing apparatus. In this case, the audio signal processing apparatus may measure the loudness level of the input audio signal. The audio signal processing apparatus may acquire loudness information of input content from a loudness measurement value. A method by which the audio signal processing apparatus measures the loudness level of the input audio signal in real time will be described in detail with reference to FIG. 19.

FIG. 14 shows the server-client structure described above with reference to FIG. 7 and FIG. 8. First, the server may extract the loudness information of the input audio signal by analyzing the input audio signal. In addition, the server may generate loudness metadata by converting the loudness information of the input audio signal into a metadata format. Next, the client may receive the input audio signal and may receive the loudness metadata of the input audio signal separately from the input audio signal. In addition, the client may acquire loudness information used in adjusting the output loudness level of the input audio signal by parsing the loudness metadata. In addition, the client may acquire a loudness gain of the input audio signal based on the loudness information and a predetermined target loudness level. The client may adjust the output loudness level of the input audio signal based on the loudness gain of the input audio signal.

Figure 15:
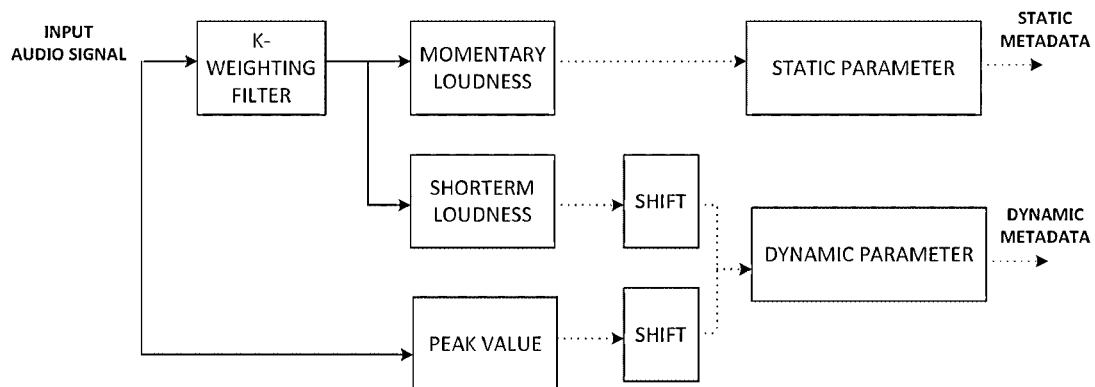
FIG. 15 is a view showing a method by which an audio signal processing apparatus according to an embodiment of the present invention acquires loudness information of an input audio signal.

FIG. 15 is a view showing a method by which an audio signal processing apparatus according to an embodiment of the present invention acquires loudness information of an input audio signal. The audio signal processing apparatus may acquire the loudness information by analyzing the input audio signal. For example, the method of FIG. 15 may be performed in the server of FIG. 7. The audio signal processing apparatus may output the loudness information in the form of loudness metadata.

According to an embodiment, the loudness information may include static loudness metadata and dynamic loudness metadata. The static loudness metadata may include at least one static loudness parameter. For example, the static loudness metadata may include at least one of the integrated loudness level, maximum sample peak, loudness range (LRA), peak-to-loudness range (PLR), album integrated loudness, relative threshold, minimum momentary loudness, maximum momentary loudness, or sample per frame of the input audio signal.

The audio signal processing apparatus may acquire static loudness metadata of the input audio signal. Specifically, the audio signal processing apparatus may measure at least one of the momentary loudness of the input audio signal or a short-term loudness level of the input audio signal by using a loudness filter based on an auditory scale. The audio signal processing apparatus may generate the static loudness metadata including at least one static loudness parameter.

The dynamic loudness metadata may represent loudness information changing over time. The dynamic loudness metadata may include at least one dynamic loudness parameter. For example, the dynamic loudness metadata may include at least one of the short-term loudness level over time or peak value of the input audio signal. A method by which the audio signal processing apparatus acquires the peak envelope will be described in detail with reference to FIG. 21.

According to an embodiment, the audio signal processing apparatus may acquire dynamic loudness metadata of the input audio signal. For example, the audio signal processing apparatus may acquire a short-term loudness measurement value for a specific section of the input audio signal. The audio signal processing apparatus may acquire the peak envelope of the input audio signal for the corresponding section. The audio signal processing apparatus may generate the dynamic loudness metadata including at least one dynamic loudness parameter. In addition, the audio signal processing apparatus may correct a time delay or a lead of the dynamic loudness parameter, such as the short-term loudness measurement value and the peak value. For example, the audio signal processing apparatus may shift the dynamic loudness range. This will be described in detail with reference to FIG. 21.

The audio signal processing apparatus may acquire a short-term loudness level for a sample value input before and a sample value to be input after a specific point of time. As a result, the audio signal processing apparatus may control a loudness level more stably with the change in the loudness of the input audio signal. For example, the audio signal processing apparatus may acquire the short-term loudness level for a sample value input before and a sample value to be input after a specific point of time. by shifting a time reference value of the already acquired dynamic loudness parameter. In addition, the audio signal processing apparatus may acquire the short-term loudness level for a sample value input before and a sample value to be input after a specific point of time by using a buffer. In this case, the audio signal processing apparatus may set a sufficient look-ahead time.

Figure 16:
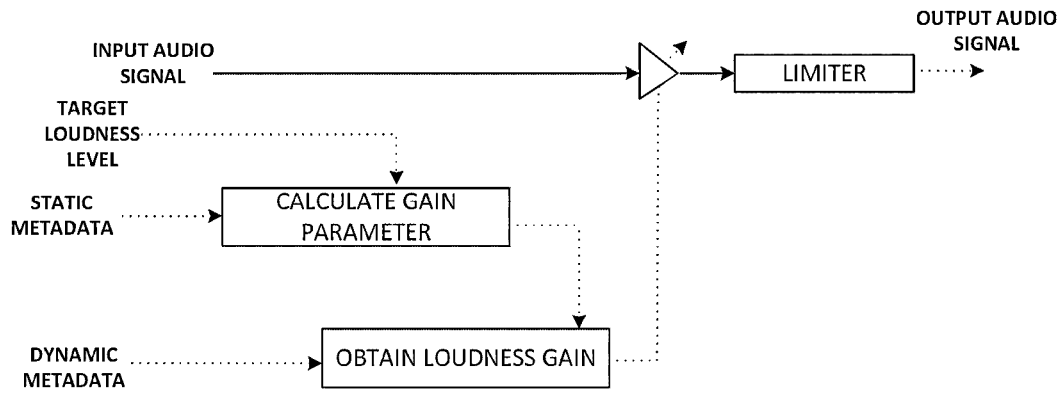
FIG. 16 is a view showing a method by which an audio signal processing apparatus according to an embodiment of the present invention adjusts the output loudness level of an input audio signal.

FIG. 16 is a view showing a method by which an audio signal processing apparatus according to an embodiment of the present invention adjusts the output loudness level of an input audio signal. The audio signal processing apparatus may acquire a loudness gain of the input audio signal based on the target loudness level and loudness metadata of the input audio signal. Specifically, the audio signal processing apparatus may calculate a gain parameter based on the target loudness level and static loudness metadata. The audio signal processing apparatus may acquire a loudness gain applied to a specific frame of the input audio signal based on the calculated gain parameter and dynamic loudness metadata. For example, the audio signal processing apparatus may parse the dynamic loudness metadata to acquire at least one of a short-term loudness level or a peak envelope corresponding to the corresponding frame. The audio signal processing apparatus may acquire the loudness gain applied to the corresponding frame based on at least one of the short-term loudness level and the peak envelope corresponding to the corresponding frame. Specifically, the audio signal processing apparatus may acquire the loudness gain applied to the corresponding frame based on the calculated gain parameter and the short-term loudness level corresponding to the corresponding frame. In this case, the loudness gain applied to the corresponding frame may be limited such that clipping according to a loudness level may not occur in the corresponding frame. The audio signal processing apparatus may correct the loudness gain applied to the corresponding frame based on the peak envelope such that clipping according to a loudness level may not occur in the corresponding frame. The audio signal processing apparatus may generate an intermediate audio signal by applying a final loudness gain to the input audio signal. In addition, the audio signal processing apparatus may generate an output audio signal by applying a limiter to the intermediate audio signal. The audio signal processing apparatus may output the output audio signal. According to an additional embodiment, when the difference in loudness gain for each frame between adjacent frames is greater than or equal to a predetermined magnitude, the audio signal processing apparatus may correct a loudness gain for each frame. In this case, the audio signal processing apparatus may use a method called Smoothing to make an adjustment such that the loudness gain is smoothly changed. As a result, the audio signal processing apparatus may prevent tone distortion due to the change in the loudness gain for each frame or volume pumping in which a level suddenly changes significantly. A method by which the audio signal processing apparatus performing smoothing on a loudness gain will be described in detail with reference to FIG. 22.

Figure 17:
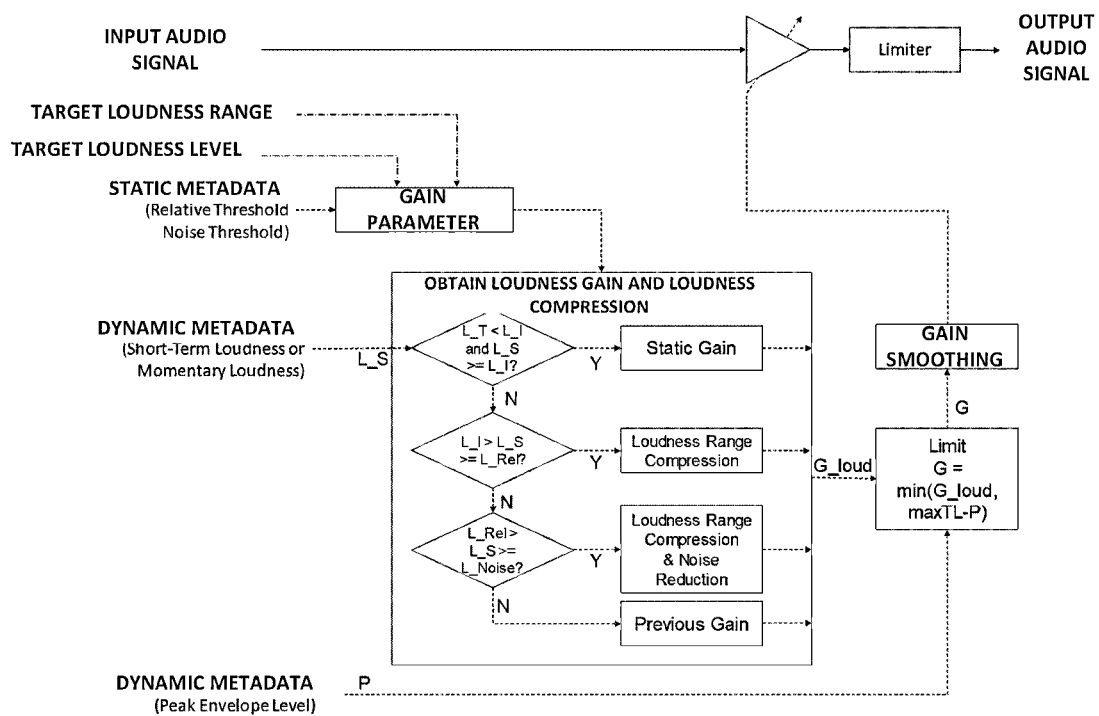
FIG. 17 is a view showing a method by which an audio signal processing apparatus according to an embodiment of the present invention adjusts the output loudness level of an input audio signal based on a target loudness range.

FIG. 17 is a view showing a method by which an audio signal processing apparatus according to an embodiment of the present invention adjusts the output loudness level of an input audio signal based on a target loudness range. The audio signal processing apparatus may additionally consider a target loudness range in the process of calculating the gain parameter of FIG. 16 described above. As described with reference to FIG. 12, the target loudness range may be narrower than a dynamic range of the input audio signal. When listening to videos/sounds at a small volume depending on an environment, or listening to music in a noisy environment such as in the subway or on a street, it is necessary to playback by reducing the dynamic range of the input audio signal.

Accordingly, the audio signal processing apparatus may calculate a gain parameter of the input audio signal based on the target loudness range of the input audio signal. In this case, the gain parameter may include a gain ratio used for loudness compression. The audio signal processing apparatus may apply an additional boost gain for a frame having a short-term loudness smaller than a predetermined magnitude among a plurality of frames included in the input audio signal based on the gain ratio. The audio signal processing apparatus may apply an additional cut gain for a frame having a short-term loudness greater than a predetermined magnitude among a plurality of frames included in the input audio signal based on the gain ratio. As a result, the audio signal processing apparatus may adjust the output loudness level of the entire section of the input audio signal to approximate the target loudspeaker level.

According to an additional embodiment, the audio signal processing apparatus may perform loudness normalization for each time section based on a loudness parameter measured differently for each time section. Specifically, the audio signal processing apparatus may determine a loudness gain G_loud for each time section of the input audio signal based on a target loudness level L_T, an integrated loudness level L_I, a short-term loudness level L_S, a relative threshold L_Rel, a noise floor level L_Noise, and a peak envelope P. Here, the L_Rel may be a value obtained by adding a predetermined value to the average of dynamic loudness parameters effective in the entire section of the input audio signal. In this case, the predetermined value may be about −20 LU. In addition, a dynamic loudness parameter may be a momentary loudness level or a short-term loudness level.

For example, the L_Rel may be a value calculated based on the average of short-term loudness levels having a value greater than at least an effective loudness level among short-term loudness levels for each section of the input audio signal. The L_Rel may be a value calculated based on the average of momentary loudness levels having a value greater than at least an effective loudness level among short-term loudness levels for each section of the input audio signal. Here, the effective loudness level may be a value set based on a loudness level which is difficult to be perceived audibly. The effective loudness level may be a value set based on a loudness level of an audio signal in which there is almost no sound. For example, the effective loudness level may be a value set based on about −70LKFS.

In addition, the L_Noise may be a value calculated based on at least one of a loudness level of a section in which there is almost no sound in the input audio signal or a loudness level of a section corresponding to a very low level of background noise in the input audio signal.

According to an embodiment, each of the L_T, the L_I, the L_S, the L_Rel, the L_Noise, and the P may be acquired through the loudness metadata described above. In addition, a time section may include a frame. In the above-described embodiment, the short-term loudness level L_S may be replaced with a representative loudness value representing a specific time section. For example, the short-term loudness level L_S may be replaced with a momentary loudness level of the input audio signal. A method by which the audio signal processing apparatus acquires the loudness gain G_loud for each time section based on the L_T, the L_I, the L_S, the L_Rel, the L_Noise, and the P may be represented as in Equation 16 below.

$$G_{loud}[n] = \begin{cases} 10^{\left(\frac{\min(L_T - L_I, clippingThreshold - P[n])}{20}\right)}, & L_T < L_I \text{ and } L_S[n] \geq L_I \\ 10^{\left(\frac{\min(-r_1(L_S[n]-L_I)+L_T-L_I, clippingThreshold-P[n])}{20}\right)}, & L_I > L_S[n] \geq L_{Rel} \\ 10^{\left(\frac{\min(-r_2(L_S[n]-L_{Rel})-r_1(L_{Rel}-L_I)+L_T-L_I, clippingThreshold-P[n])}{20}\right)}, & L_I > L_S[n] \geq L_{Rel} \\ G_{loud}[n-1], & \text{otherwise} \end{cases}$$

where $1 \geq r_1 \geq r_2 > 0$

[Equation 16]

In Equation 16, r_1 and r_2 may represent a loudness compression ratio for controlling a dynamic range of an output audio signal with respect to the input audio signal. r1 may be a loudness compression ratio used to acquire a loudness gain of a corresponding section in the section in which an input loudness level of the input audio signal is less than at least the integrated loudness level. The r_1 may be set based on at least one of LRA, PLR, or an instantaneous loudness maximum value representing the loudness range of the input audio signal. The r_1 may be an arbitrary constant between 0 and 1. The r_2 may be a compression ratio used to acquire a loudness gain of a corresponding section in the section in which the input loudness level of the input audio signal is less than the integrated loudness level and the input loudness level of the same is less than the L_Rel. In this case, the r_2 may be set to a value less than at least the r_1 to minimize the boost of a noise component. The audio signal processing apparatus may perform smoothing on G_loud[n] to apply the smoothed G_loud[n] to the input audio signal. In addition, clippingThreshold may represent a allowed maximum sample peak envelope. The clippingThreshold may be a value set based on at least one of the above-described QSHI, a maximum true peak truePeak, and the allowed maximum sample peak envelope. For example, the clippingThreshold may be the same value as the QSHI. Alternatively, the clippingThreshold may be a value arbitrarily set in the audio signal processing apparatus or in an audio providing system.

Figure 18:
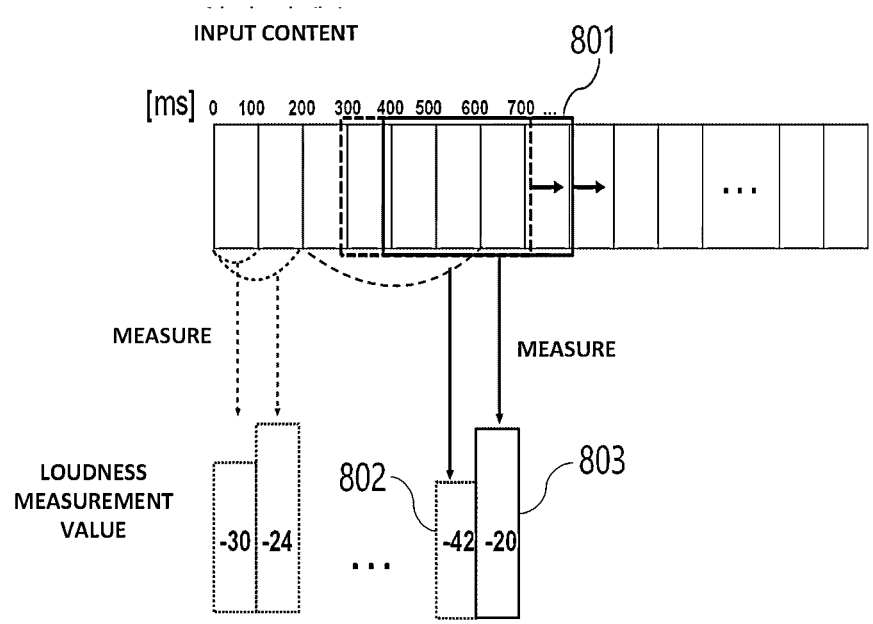
FIG. 18 is a view showing a method by which an audio signal processing apparatus measures the loudness of input content according to an embodiment of the present invention.

Hereinafter, a method by which the audio signal processing apparatus according to an embodiment of the present invention acquires a loudness measurement value will be described in detail with reference to FIG. 18. FIG. 18 is a view showing a method by which an audio signal processing apparatus measures the loudness of input content according to an embodiment of the present invention. According to an embodiment, the audio signal processing apparatus may measure the loudness of input content based on the above-described measurement window. In addition, the audio signal processing apparatus may acquire a loudness measurement value for each measurement window of the input content. The audio signal processing apparatus may acquire loudness information based on the loudness measurement value for each measurement window.

In the embodiment of FIG. 18, the audio signal processing apparatus may acquire a measurement value for each measurement window based on the length of a measurement window 801. In this case, the length of the measurement window 801 may be a default value pre-stored in the audio signal processing apparatus. According to an embodiment of the present invention, the length of the measurement window 801 may vary depending on input content. For example, the audio signal processing apparatus may acquire the length of a measurement window corresponding to the input content based on additional information of the input content. In the embodiment of FIG. 18, the length of the measurement window corresponding to the input content may be about 400 ms. The audio signal processing apparatus may acquire a loudness measurement value corresponding to a specific section having a length of about 400 ms among all sections of the input content.

According to an embodiment, the length of a measurement window may be acquired based on additional information. For example, the length of a measurement window may be acquired based on a loudness range of input content. Here, the loudness range may be a value representing a loudness level distribution for all sections of the content. The loudness range may be indicated by using a unit representing a relative measurement amount, such as LU. The audio signal processing apparatus may acquire information on the loudness range of the input content from the additional information. Next, the audio signal processing apparatus may determine the length of the measurement window based on the loudness range of the input content. In this case, the length of the measurement window of the input content may be set to a value less than the length of a measurement window of other content having a width of a loudness range wider than the loudness range of the input content. For example, when the loudness range of first input content is greater than the loudness range of second input content, the length of a measurement window for the first input content may be greater than the length of a measurement window for the second input content.

In addition, the audio signal processing apparatus may acquire the loudness measurement value for each measurement window according to a measurement cycle for acquiring a measurement value for the input content. In the present disclosure, the measurement cycle may represent a temporal distance in which a measurement window is moved. Referring to FIG. 18, a first measurement value 802 may be a loudness measurement value corresponding to a section (300 ms to 700 ms) based on a point of time at which the input content starts to be played back. In addition, a first measurement value 803 may be a loudness measurement value corresponding to a section (400 ms to 800 ms) based on a point of time at which the input content starts to be played back. When the length of time from the point of time at which the input content starts to be played back to a current point of time is less than the length of the measurement window, the audio signal processing apparatus may acquire a loudness measurement value in the nearest measurement cycle which comes after the current point of time. In this case, the audio signal processing apparatus may acquire a loudness measurement value corresponding to a section shorter than the length of the measurement window.

Specifically, the audio signal processing apparatus may determine the measurement cycle based on the additional information. For example, the measurement cycle may be determined based on the length of the input content. For example, when the length of the second input content is greater than the length of the first input content, the measurement cycle of the first input content may be shorter than the measurement cycle of the second input content. In addition, the audio signal processing apparatus may acquire the loudness measurement value for each measurement window based on the determined measurement cycle. In the embodiment of FIG. 18, the measurement cycle may be about 100 ms. The audio signal processing apparatus may acquire the loudness measurement value for each measurement window by moving a measurement window every 100 mn. In addition, the audio signal processing apparatus may acquire the above-described loudness information based on a plurality of loudness measurement values measured through FIG. 18.

Figure 19:
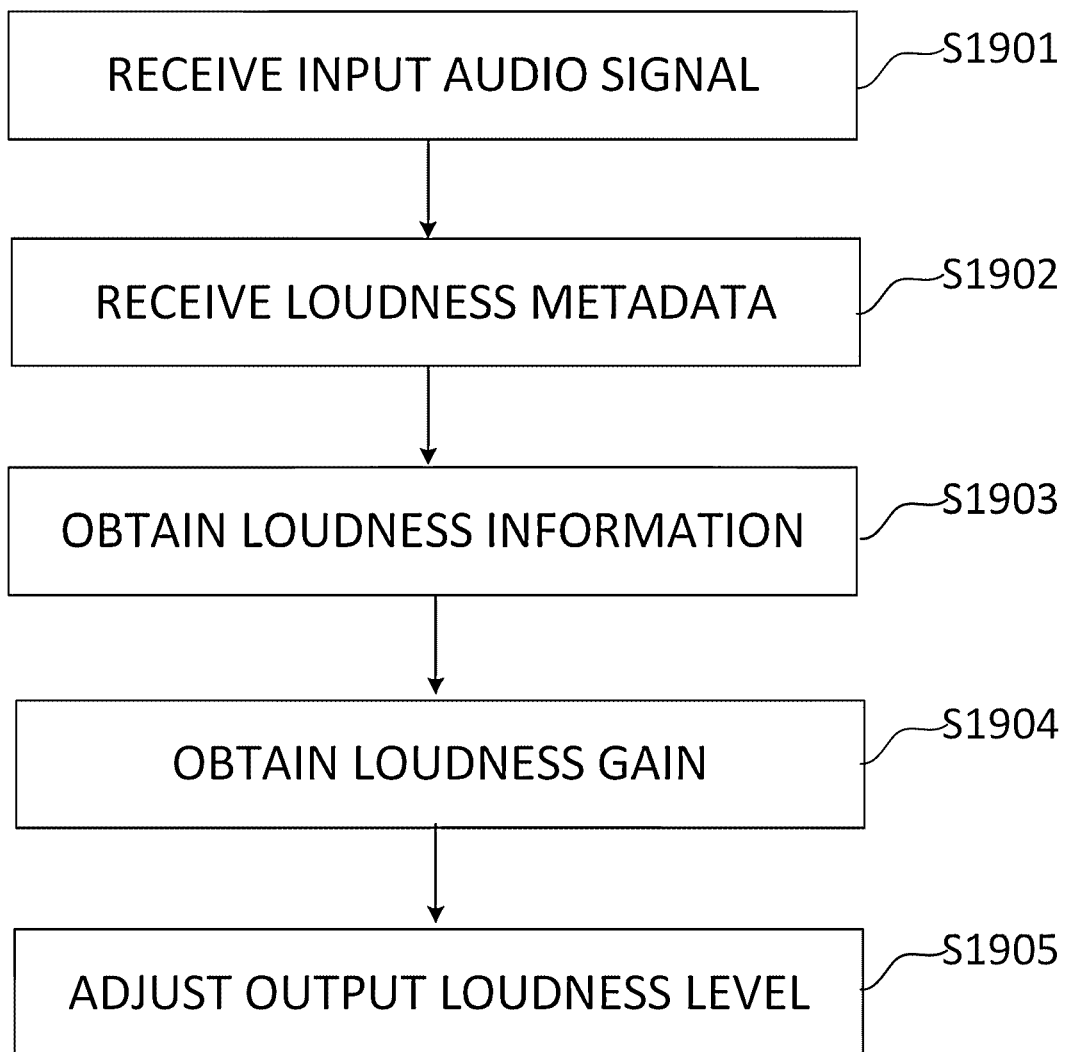
FIG. 19 is a flow chart showing the operation of audio signal processing apparatus according to an embodiment of the present invention.

FIG. 19 is a flow chart showing the operation of audio signal processing apparatus according to an embodiment of the present invention. The audio signal processing apparatus according to an embodiment of the present invention may receive an input audio signal Step S1901. In this case, the input audio signal may include the input content described with reference to FIG. 2. Next, the audio signal processing apparatus may receive loudness metadata corresponding to the input audio signal Step S1902.

Next, the audio signal processing apparatus may acquire loudness information of the input audio signal by parsing the loudness metadata Step S1903. According to an embodiment of the present invention, the loudness information may include at least one of information representing each of the integrated loudness level of the input audio signal, at least one short-term loudness level, a quality secure histogram index (QSHI), the dynamic range of the input audio signal, loudness energy for each frequency, a loudness ratio for each frequency, or a peak envelope. To a method by which the audio signal processing apparatus acquires each information included in the loudness information, the embodiments described above with reference to FIG. 2 to FIG. 18 described above may be applied.

The QSHI may represent a threshold loudness level at which cognitive sound quality damage does not occur. The QSHI may be acquired according to the above-described Step S303 of FIG. 3, the QSHI extraction unit 404 of FIG. 4, and the embodiments described with reference to FIG. 10. For example, the QSHI may be a loudness parameter calculated based on a loudness histogram of the input audio signal. In this case, the loudness histogram may be a magnitude histogram of short-term loudness levels over time of the input audio signal. Alternatively, the loudness histogram may be a magnitude histogram related to a peak envelope or a root-mean-square (RMS) for each section of the input audio signal. The QHSI may be greater than the integrated loudness level of the input audio signal.

According to an embodiment, the QSHI is a parameter calculated based on a prediction loudness histogram predicted from the loudness histogram of the input audio signal. In this case, the prediction loudness histogram may be a histogram generated based on a loudness parameter predicted when the input audio signal is output according to a target loudness level.

According to an embodiment, the QSHI may be determined based on the number of times a limiter is driven in the audio signal processing apparatus. In this case, the audio signal processing apparatus may output an output audio signal by applying a loudness limiter for limiting the loudness level of an output audio signal to the output audio signal. In this case, the output audio signal may be a signal in which an output loudness level of the input audio signal is adjusted according to a loudness gain. The QHSI may be a parameter set such that short-term loudness levels of the entire section of the output audio signal are less than or equal to a predetermined level.

Next, the audio signal processing apparatus may acquire a loudness gain of the input audio signal based on loudness information and a target loudness level S1904. According to an embodiment, the loudness gain of the input audio signal may be a fixed gain having a fixed value in the entire section of the input audio signal. According to another embodiment, the loudness gain of the input audio signal may be a gain changing over time during the time the input audio signal is played back.

According to an embodiment of the present invention, the audio signal processing apparatus may receive integrated loudness of the input audio signal. In addition, the audio signal processing apparatus may determine a loudness gain based on the integrated loudness of the input audio signal, the QSHI, and the target loudness level.

According to an embodiment, the audio signal processing apparatus may compare the target loudness level of the input audio signal with the QSHI. In addition, the audio signal processing apparatus may determine the loudness gain based on the comparison result. The audio signal processing apparatus may determine the loudness gain based on the smaller of the target loudness level of the input audio signal and the QSHI. To this, the specific embodiments described with reference to FIG. 10 may be applied.

According to an embodiment, the audio signal processing apparatus may acquire the loudness gain of the input audio signal based on a QSHI corrected from the QSHI of the input audio signal. For example, the audio signal processing apparatus may perform post-processing on the input audio signal. In this case, the audio signal processing apparatus may receive post-processing information representing characteristics of the post-processing on the input audio signal. In addition, the audio signal processing apparatus may correct a pre-acquired QSHI based on the post-processing information. According to an embodiment, the audio signal processing apparatus may correct the pre-acquired QSHI based on the post-processing information and a pre-stored function. The audio signal processing apparatus may correct the pre-acquired QSHI based on the post-processing information and a pre-stored look-up table. In this case, the pre-stored look-up table may include information on QSHI correction according to the characteristics of the post-processing. In addition, the information on QSHI correction may include information representing a QSHI correction value according to the characteristics of the post-processing. The audio signal processing apparatus may acquire a QSHI correction value corresponding to the post-processing on the input audio signal based on the pre-stored look-up table. The audio signal processing apparatus may correct the QSHI by adding the QSHI correction value to the acquired QSHI. The audio signal processing apparatus may determine the loudness gain of the input audio signal based on the QSHI corrected by the above-described method.

According to an embodiment, the audio signal processing apparatus may determine the loudness gain of the input audio signal based on loudness energy for each frequency and the post-processing information representing the characteristics of the post-processing on the input audio signal. The audio signal processing apparatus may determine the loudness gain of the input audio signal based on a loudness level for each band changed by post-processing.

According to an embodiment, the audio signal processing apparatus may acquire the loudness level for each band changed by the post-processing based on the loudness energy for each frequency and the post-processing information representing the characteristics of the post-processing on the input audio signal. The audio signal processing apparatus may acquire the loudness level for each band changed by post-processing based on a loudness ratio for each frequency and the post-processing information of the input audio signal. The loudness level for each band changed by post-processing may be calculated based on a dot product of a loudness ratio for each frequency of the input audio signal. The loudness level for each band changed by post-processing may also be a parameter acquired based on cognitive loudness characteristics. The audio signal processing apparatus may acquire the loudness level for each band changed by post-processing of the input audio signal based on a loudness filter based on an auditory scale. Specifically, the loudness filter may be at least one of an inverse filter of an equal-loudness contours or a K-weighting filter approximating the same. When the loudness level of a specific frame among a plurality of frames included in the input audio signal is less than or equal to a relative threshold value, the audio signal processing apparatus may not calculate the loudness level for each band changed by post-processing corresponding to the corresponding frame. As another example, the loudness level for each band changed by post-processing of the input audio signal may be a parameter set based on at least one of the genre of the input audio signal or a user input.

The loudness ratio for each frequency of the input audio signal and/or the loudness energy for each frequency of the same may be a value calculated based on a loudness measurement value for the input audio signal. The loudness ratio for each frequency of the input audio signal may be a parameter acquired based on the cognitive loudness characteristics. The audio signal processing apparatus may acquire the loudness ratio for each frequency of the input audio signal based on a loudness filter based on an auditory scale. Specifically, the loudness filter may be at least one of an inverse filter of an equal-loudness contours or a K-weighting filter approximating the same. When the loudness level of a specific frame among a plurality of frames included in the input audio signal is less than or equal to a relative threshold value, the audio signal processing apparatus may not calculate a loudness ratio for each frequency corresponding to the corresponding frame. The loudness ratio for each frequency may be acquired according to the embodiment described with reference to the loudness analysis unit for each frequency 402 of FIG. 4. As another example, the loudness ratio for each frequency of the input audio signal may be a parameter set based on at least one of the genre of the input audio signal or a user input.

The audio signal processing apparatus may acquire post-processing information on the input audio signal based on the user input. In this case, the user input may be an input related to the input audio signal. In addition, a user may be a user who uses the audio signal processing apparatus. The post-processing information may include at least one of information representing each of output characteristics of the audio signal processing apparatus, the genre of the input audio signal, a post-processing mode according to the user input, the type of equalization, reverberation, or room compensation. To a method by which the audio signal processing apparatus determines the loudness gain of the input audio signal based on the loudness level for each band changed by post-processing, the embodiments described with reference to Step S303 of FIG. 3 may be applied.

According to an embodiment, the audio signal processing apparatus may determine the loudness gain of the input audio signal based on a difference in loudness. The difference in loudness may be a predicted value for the change in loudness of the input audio signal by post-processing. The audio signal processing apparatus may acquire the difference in loudness based on post-processing information set by a user. The audio signal processing apparatus may acquire the difference in loudness based on at least one of characteristics of the input audio signal for each frequency or the loudness level for each band changed by post-processing. The difference in loudness may be calculated based on the dot product of a loudness ratio for each frequency of the input audio signal. The difference in loudness may be a parameter acquired based on the cognitive loudness characteristics. The audio signal processing apparatus may acquire the difference in loudness of the input audio signal based on a loudness filter based on an auditory scale. Specifically, the loudness filter may be at least one of an inverse filter of an equal-loudness contours or a K-weighting filter approximating the same. When the loudness level of a specific frame among a plurality of frames included in the input audio signal is less than or equal to a relative threshold value, the audio signal processing apparatus may not calculate a difference in loudness corresponding to the corresponding frame. To a method by which the audio signal processing apparatus acquires the difference in loudness, the embodiments described with reference to the loudness analysis unit for each frequency 402 of FIG. 4 and the post-processing loudness prediction unit 403 of the same may be applied.

According to an embodiment, the audio signal processing apparatus may determine the loudness gain of the input audio signal based on loudness information for each frame of the input audio signal. The audio signal processing apparatus may acquire a loudness gain for each frame of the input audio signal based on the loudness information for each frame of the input audio signal. The loudness gain of the input audio signal may be a gain changing over time during the time the input audio signal is played back. According to an embodiment, the audio signal processing apparatus may receive loudness metadata including the loudness information for each frame of the input audio signal. The audio signal processing apparatus may acquire the loudness information for each frame of the input audio signal by parsing the loudness metadata. The loudness information for each frame may include a dynamic loudness parameter. According to an embodiment, the loudness information for each frame may include information representing a peak envelope for each frame. The peak envelope for each frame may be acquired based on the maximum absolute value of an audio signal included in a frame having a predetermined length.

According to an embodiment, the audio signal processing apparatus may determine the loudness gain for each frame of the input audio signal based on the peak envelope for each frame of the input audio signal. The audio signal processing apparatus may determine the loudness gain for each frame of the input audio signal based on the target loudness level and the peak envelope for each frame of the input audio signal. For example, the audio signal processing apparatus may set the loudness gain for each frame so as not to exceed the peak envelope for each frame based on the target loudness level. In addition, the audio signal processing apparatus may adjust an output loudness level of a corresponding frame of the input audio signal based on the loudness gain for each frame. To a method by which the audio signal processing apparatus determines a loudness gain based on the loudness information for each frame, the embodiments described with reference to FIG. 17 described above may be applied.

Next, the audio signal processing apparatus may adjust the output loudness level of the input audio signal based on the loudness gain S1905. According to an embodiment, the audio signal processing apparatus may generate an output audio signal by adjusting the output loudness level of the input audio signal. In this case, the audio signal processing apparatus may use the determined loudness gain. According to an embodiment, the audio signal processing apparatus may output the generated output audio signal by applying a loudness limiter to the same.

According to an additional embodiment of the present invention, the audio signal processing apparatus may adjust the output loudness level of the input audio signal based on a section loudness gain for some sections of the entire section of the input audio signal. According to an embodiment, the audio signal processing apparatus may acquire a loudness gain corresponding to a corresponding section based on a loudness parameter corresponding to a specific section of the input audio signal. For example, the loudness parameter corresponding to a specific section of the input audio signal may include at least one representative value for the corresponding section. In this case, the representative value may include at least one of the maximum value of an absolute value of a loudness level of the input audio signal corresponding to a corresponding section or a short-term loudness level.

According to an embodiment, the audio signal processing apparatus may determine a loudness gain for each time section of the input audio signal based on a target loudness level, an integrated loudness level, and an input loudness level. In this case, the input loudness level may be a loudness level representing a specific section. For example, the input loudness level may be a short-term loudness level. The audio signal processing apparatus may compare at least two or more of the target loudness level, the integrated loudness level, the input loudness level, a relative threshold, a noise floor level L_Noise, or a peak envelope to each other. In addition, the audio signal processing apparatus may determine the loudness gain for each time section of the input audio signal based on the comparison result.

For example, the audio signal processing apparatus may compare the target loudness level and the integrated loudness level. The audio signal processing apparatus may compare the input loudness level and the integrated loudness level. When the target loudness level is less than the integrated loudness level, and the input loudness level is greater than the integrated loudness level, the audio signal processing apparatus may apply a first loudness gain for each section to an input audio signal of a corresponding section.

As another example, when the target loudness level is greater than the integrated loudness level, the input loudness level is less than the integrated loudness level, and the input loudness level is greater than the relative threshold, the audio signal processing apparatus may apply a second loudness gain for each section to an input audio signal of a corresponding section.

As yet another example, when the target loudness level is greater than the integrated loudness level, the input loudness level is less than the integrated loudness level, the input loudness level is less than the relative threshold, and the input loudness level is greater than the noise floor level, the audio signal processing apparatus may apply a third loudness gain for each section to an input audio signal of a corresponding section.

As still yet another example, when the target loudness level is greater than the integrated loudness level, the input loudness level is less than the integrated loudness level, the input loudness level is less than the relative threshold, and the input loudness level is less than the noise floor level, the audio signal processing apparatus may apply a fourth loudness gain for each section to an input audio signal of a corresponding section. In this case, the fourth loudness gain for each section may be a loudness gain of a frame preceding the corresponding frame. For example, when the target loudness level is greater than the integrated loudness level, an input loudness level corresponding to an N-th frame is less than the integrated loudness level, the input loudness level corresponding to the N-th frame is less than the relative threshold, and the input loudness level corresponding to the N-th frame is less the noise floor level, the audio signal processing apparatus may use a loudness gain corresponding to an N−1-th frame as a loudness gain corresponding to the N-th frame.

According to another embodiment, the fourth loudness gain for each section may represent a fixed gain applied to the entire input audio signal. In addition, each of the first loudness gain for each section, the second loudness gain for each section, and the third loudness gain for each section may be a gain corrected by a different method from the fourth loudness gain for each section. In addition, the first loudness gain for each section, the second loudness gain for each section, and the third loudness gain for each section may be gains having different values.

According to an embodiment, a loudness representative value of an N-th section of the input audio signal may be a representative value corresponding to a section adjacent to the N-th section of the input audio signal. For example, the representative loudness value of an N-th specific section of the input audio signal may be a representative value corresponding to an N+L-th section or an N-L-th section. In this case, L may be an index value corresponding to a section smaller than a time section for acquiring a representative value. For example, the time section for acquiring a representative value may be three seconds. In addition, the audio signal processing apparatus may acquire a representative value of a specific section of the input audio signal based on a time-delayed input audio signal. In this case, the audio signal processing apparatus may acquire at least one loudness measurement value used for acquiring a representative value by delaying the input audio signal based on a predetermined delay time.

According to an embodiment, the audio signal processing apparatus may acquire a loudness fixed gain applied to the entire input audio signal. In this case, the audio signal processing apparatus may correct the loudness fixed gain based on the loudness parameter corresponding to a specific section of the input audio signal. In addition, the audio signal processing apparatus may adjust the output loudness level of an input audio signal of the corresponding section based on the corrected gain. To a method by which an input audio signal processing apparatus adjusts the output loudness level of the input audio signal based on a section loudness gain for some sections of the entire section of the input audio signal, the embodiments described with reference to FIG. 17 described above may be applied.

Figure 20:
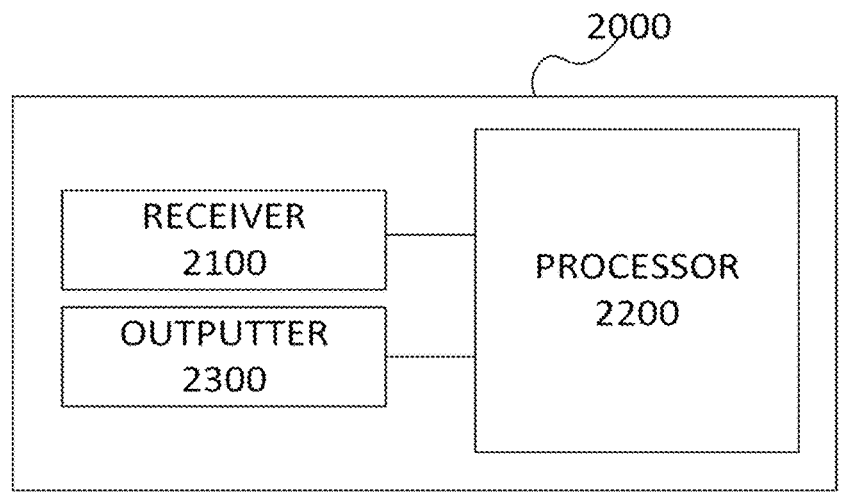
FIG. 20 is a block diagram showing the configuration of an audio signal processing apparatus 2000 according to an embodiment of the present invention.

FIG. 20 is a block diagram showing the configuration of an audio signal processing apparatus 2000 according to an embodiment of the present invention. According to an embodiment, an audio signal processing apparatus 2000 may include a receiver 2100, a processor 2200, and an outputter 2300. However, not all of the components illustrated in FIG. 10 are essential components of the audio signal processing apparatus. The audio signal processing apparatus 2000 may further include components not illustrated in FIG. 20. For example, the audio signal processing apparatus according to an embodiment may further include a storage unit (not illustrated). Also, at least some of the components of the audio signal processing apparatus 2000 illustrated in FIG. 20 may be omitted. For example, the audio signal processing apparatus according to an embodiment may not include at least one of the receiver 2100 or the outputter 2300.

The receiver 2100 may receive input content input to the audio signal processing apparatus 2000. The receiver 2100 may receive input content whose output loudness level is adjusted by the processor 2200. As described above, the input content may include an audio signal. In this case, the audio signal may include at least one of an ambisonics signal, an object signal, or a channel signal. The audio signal may be one object signal or a mono signal. The audio signal may be a multi-object signal or a multi-channel signal. According to an embodiment, the receiver 2100 may include an input terminal which receives input content transmitted in a wired manner. In addition, the receiver 2100 may include a wireless reception module which receives input content transmitted in a wireless manner.

According to an embodiment, the audio signal processing apparatus 2000 may include a separate decoder. In this case, the receiver 2100 may receive an encoded bitstream of input content. In addition, the encoded bitstream may be decoded as the input content through a decoder. Additionally, the receiver 2100 may receive additional information related to the input content.

According to an embodiment, the receiver 2100 may be include a transmitting/receiving means for transmitting/receiving data to and from external devices through a network. In this case, the data may include at least one of the bitstream of the input content or the additional information. The receiver 2100 may include a wired transmission/reception terminal for receiving data transmitted in a wired manner. In addition, the receiver 2100 may include a wireless transmission/reception terminal for receiving data transmitted in a wireless manner. In this case, the receiver 2100 may receive data transmitted in a wireless manner using a Bluetooth or Wi-Fi communication method. In addition, the receiver 2100 may receive data transmitted according to mobile communication standards such as long term evolution (LTE) and LTE-advanced, but the present disclosure is not limited thereto. The receiver 2100 may receive various forms of data transmitted according to a variety of wired and wireless communication standards.

The processor 2200 may control the overall operation of the audio signal processing apparatus 2000. The processor 2200 may control each component of the audio signal processing apparatus 2000. The processor 2200 may perform calculations and processing of various data and signals. The processor 2200 may be implemented as hardware in the form of a semiconductor chip or an electronic circuit, or may be implemented as software which controls the hardware. The processor 2200 may be implemented in a form in which the hardware and the software are combined. For example, the processor 2200 may control operations of the receiver 2100 and the outputter 2300 by executing at least one program. In addition, the processor 2200 may perform the operations described with reference to FIG. 1 to FIG. 19 described above by executing at least one program.

According to an embodiment, the processor 2200 may adjust an output loudness level of the input content. For example, the processor 2200 may adjust the output loudness level of the input content based on a loudness gain. Loudness information may be loudness characteristics of the input content analyzed from the input content. In this case, the loudness gain may be acquired based on the loudness information. In addition, the processor 2200 may output output content whose output loudness level has been adjusted from the input content. In this case, the processor 2200 may output the output content through the outputter 2300 to be described later.

The outputter 2300 may output output content. The outputter 2300 may output output content whose output loudness level has been adjusted from the input content by the processor 2200. Here, the output content may include an output audio signal. In this case, the output audio signal may include at least one of an ambisonics signal, an object signal, or a channel signal. The output audio signal may be a multi-object signal or a multi-channel signal. In addition, the output audio signal may include a 2-channel output audio signal respectively corresponding to both ears of a listener. The output audio signal may include a binaural 2-channel output audio signal. The outputter 2300 may output an audio headphone signal whose output loudness level has been adjusted by the processor 2200.

According to an embodiment, the outputter 2300 may include an output means for outputting output content. For example, the outputter 2300 may include an output terminal which outputs an output audio signal to the outside. In this case, the audio signal processing apparatus 2000 may output the output audio signal to an external device connected to the output terminal. The outputter 2300 may include a wireless transmission/reception module which outputs the output audio signal to the outside. In this case, the outputter 2300 may output the output audio signal to the outside using a wireless communication method such as Bluetooth or Wi-Fi.

In addition, the outputter 2300 may include a speaker. In this case, the audio signal processing apparatus 2000 may output an output audio signal through the speaker. In addition, the outputter 2300 may further include a converter (for example, a digital-to-analog converter, DAC) which converts a digital audio signal into an analog audio signal. Additionally, the outputter 2300 may include a display means for outputting a video signal included in the output content.

As described above, the audio signal processing apparatus 2200 may further include a storage unit (not illustrated). The storage unit may store at least one of data or programs for processing and controlling the processor 2200. In addition, the storage unit may store loudness information. The storage unit may store loudness information extracted from received loudness metadata. The storage unit may store a received target loudness level. In addition, the storage unit may store a loudness measurement value acquired though the processor 2200. In addition, the storage unit may store results calculated in the processor 2200. For example, the storage unit may store a loudness gain determined based on the loudness information. In addition, the storage unit may store data input to the audio signal processing apparatus 2000 or output from the audio signal processing apparatus 2000.

The storage unit may include at least one memory. In this case, the memory may include at least one type of storage medium among a flash memory type storage medium, a hard disk type storage medium, a multimedia card micro type storage medium, a card type memory (for example, an SD or XD memory), a Random Access Memory (RAM), a Static Random Access Memory (SRAM), a Read-Only Memory (ROM), an Electrically Erasable Programmable Read-Only Memory (EEPROM), a Programmable Read-Only Memory (PROM), a magnetic memory, a magnetic disk, or an optical disk.

Figure 21:
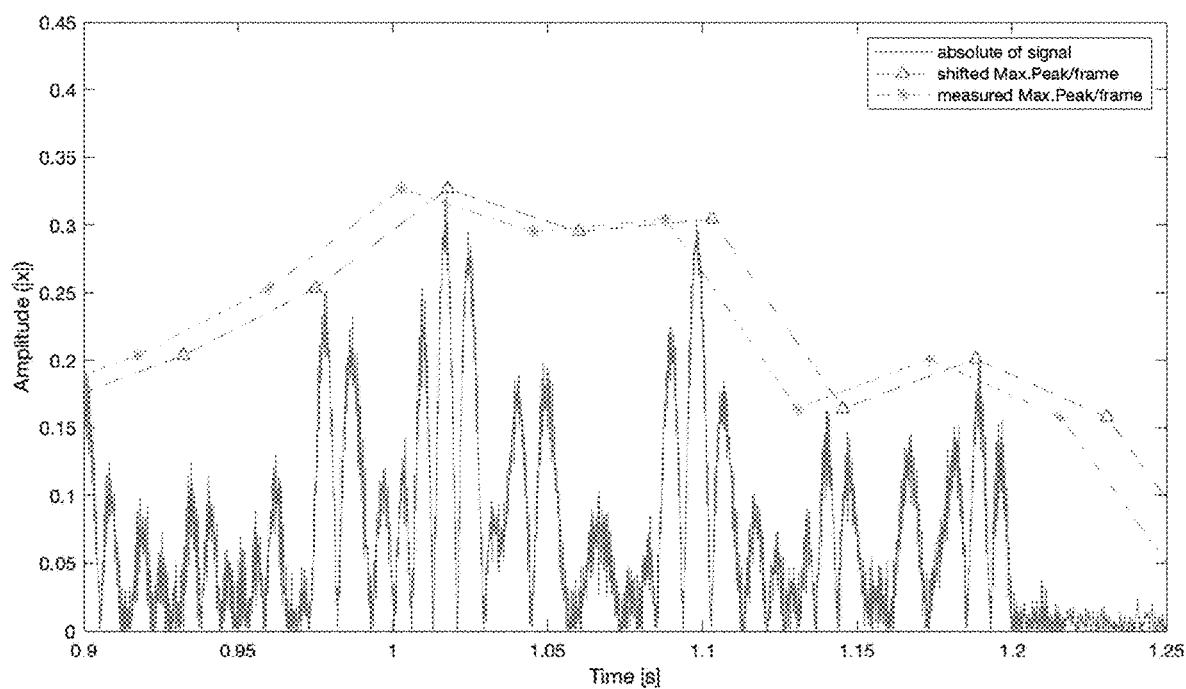
FIG. 21 is a view showing a peak envelope for each time section of an input audio signal according to an embodiment of the present invention.

FIG. 21 is a view showing a peak envelope for each time section of an input audio signal according to an embodiment of the present invention. In the embodiment of FIG. 21, a peak envelope for each time section may be a value acquired based on a loudness measurement value measured from an input audio signal. In FIG. 21, values indicated by solid lines represent loudness measurement values over time of the input audio signal. In addition, values indicated by a first broken line (-*-) represent representative values for each time section of the loudness measurement values over time of the input audio signal. An audio signal processing apparatus may acquire a peak envelope for each time section based on the representative value for each time section. In this case, the corresponding representative values are calculated based on values input to an input buffer of a loudness meter, so that an error may occur based on an actual input audio signal.

In FIG. 21, values indicated by a second broken line (-Δ-) may be representative values for each time section acquired through a time delay of about 15 ms. The audio signal processing apparatus may acquire a representative value for each time section by applying a time delay to the input audio signal. As a result, the audio signal processing apparatus may correct the acquired peak envelope so as to better correspond to the change in loudness of the input audio signal. In this case, a delay duration used for the time delay may be set based on the length of a measurement frame of the input audio signal. The method for correcting the time delay of the peak envelope described with reference to FIG. 21 may be applied to other dynamic loudness parameters described with reference to FIG. 15. For example, the audio signal processing apparatus may acquire a short-term loudness level by using a time delay.

Figure 22:
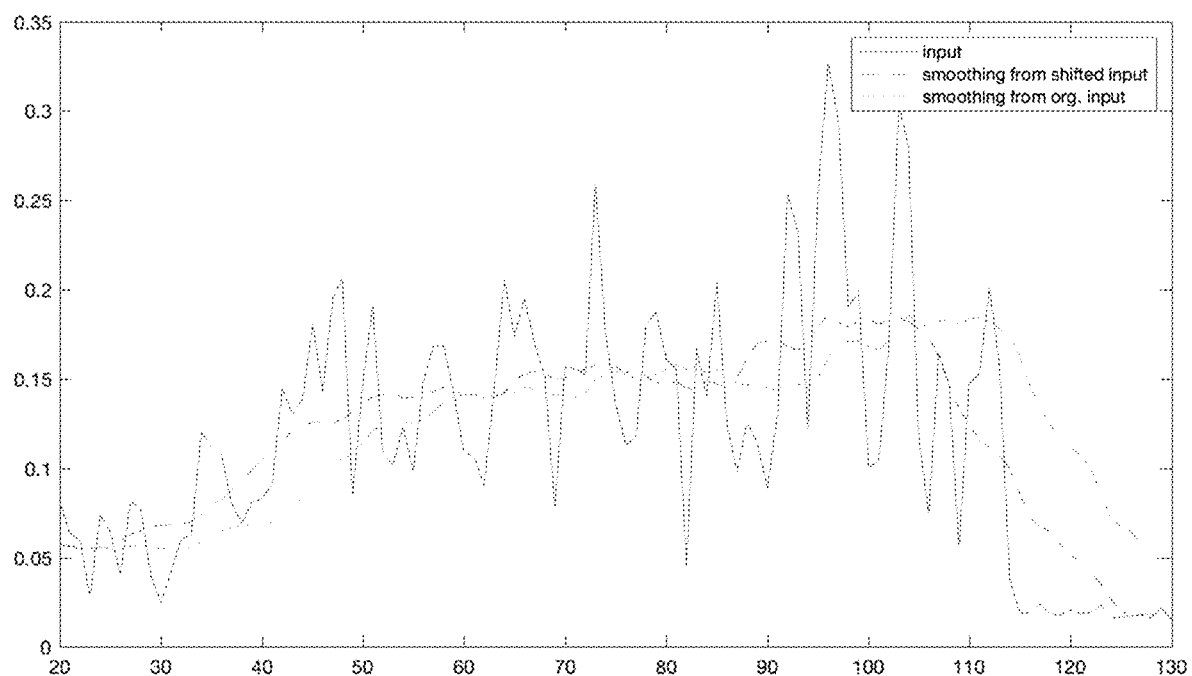
FIG. 22 is a view describing a method by which an audio signal processing apparatus according to an embodiment of the present invention adjusts the output loudness level of an using input audio signal using smoothing.

FIG. 22 is a view describing a method by which an audio signal processing apparatus according to an embodiment of the present invention adjusts the output loudness level of an using input audio signal using smoothing. According to an embodiment of the present invention, the audio signal processing apparatus may adjust the output loudness level of an input audio signal such that a loudness gain is smoothly changed through smoothing. In this case, since smoothing is performed based on a loudness measurement value of the input audio signal (Causal Processing), the audio signal processing apparatus may not be able to properly provide a parameter required in a corresponding frame with respect to an actual loudness change.

Accordingly, the audio signal processing apparatus may perform a smoothing operation on a loudness gain of the input audio signal by using a loudness parameter acquired though a time delay. In this case, the loudness parameter acquired though a time delay may be a parameter acquired by the method described above with reference to FIG. 21.

In FIG. 22, values indicated by solid lines may represent a loudness gain for each frame of the input audio signal. In this case, the values indicated by solid lines may represent a loudness gain to which smoothing has not been applied. In addition, values indicated by a third broken line (--) and a fourth broken line (-•-) may be a loudness gain to which smoothing is applied from the loudness gain for each frame. In this case, each loudness gain for each frame indicated by the third broken line (--) may represent a first loudness gain for each frame (smoothing from shifted input) acquired based on measurement values to which a time delay has been applied. On the other hand, each loudness gain for each frame indicated by the fourth broken line (-•-) may represent a second loudness gain for each frame (smoothing from org. input) acquired based on measurement values to which a time delay has not been applied.

Referring to FIG. 22, compared to the first loudness gain for each frame, the second loudness gain for each frame may change more similarly to the loudness level of the input audio signal. Referring to a section of FIG. 22, in which a frame index, which is the horizontal axis, is about 110 to about 130, the loudness gain for each frame of the input audio signal to which smoothing has not been applied is rapidly reduced. In the corresponding section, the first loudness gain for each frame is gradually reduced compared to the second loudness gain for each frame. The second loudness gain for each frame is rapidly reduced compared to the first loudness gain for each frame. In addition, the first loudness gain for each frame begins to be reduced by a predetermined frame compared to the second loudness gain for each frame. Accordingly, the audio signal processing apparatus may prevent a listener from experiencing a sudden change in loudness by using the first loudness gain for each frame acquired based on measurement values to which a time delay has been applied.

According to an embodiment of the present invention, the audio signal processing apparatus may apply a loudness gain determined for each section to the input audio signal in order to process the characteristics of the input audio signal according to the target loudness level. In this case, an excessive loudness gain value may be applied in a specific section. As a result, clipping greater than 0 dBFS or greater than a predefined value (Threshold) value may occur. Accordingly, the audio signal processing apparatus may apply a limiter to an output audio signal. As a result, the audio signal processing apparatus may apply a limiter to a section in which the loudness level of an output audio signal whose output loudness level has been adjusted from the input audio signal is greater than a predetermined loudness level.

In this case, a method in which the output audio signal is processed in the limiter may be processed in real time or in accordance with a time order (Causal Processing) according to a limiter parameter related to the limiter. When the audio signal processing apparatus uses a limiter, the audio signal processing apparatus may cause unintended tone distortion. As described above, the audio signal processing apparatus may adjust the output loudness level of the input audio signal by using the loudness gain determined for each section. In this case, the loudness gain determined for each section may be a gain in consideration of a peak envelope for each section. The audio signal processing apparatus may predict clipping occurring in a corresponding section or the generation of a section having a level exceeding the target loudness level based on the peak envelope for each section. In addition, the audio signal processing apparatus may determine the loudness gain for each section of the input audio signal based on the above prediction. That is, the audio signal processing apparatus may inversely correct the loudness gain based on the prediction. As a result, the audio signal processing apparatus may prevent the tone distortion of the output audio signal caused by the limiter.

Some embodiments may also be implemented in the form of a recording medium including instructions executable by a computer, such as a program module executed by a computer. A computer-readable medium may be any available medium which may be accessed by a computer, and may include volatile and non-volatile media and removable and non-removable media. In addition, the computer-readable medium may include a computer storage medium. The computer storage medium may include volatile and non-volatile media and removable and non-removable media implemented in any method or technology for the storage of information, such as computer-readable instructions, data structures, program modules, or other data.

Although the present disclosure has been described with reference to the specific embodiments, the present disclosure is not limited thereto. Therefore, it will be readily understood by those skilled in the art that various modifications and changes can be made thereto without departing from the scope of the present disclosure. That is, although the present disclosure has been described with respect to an embodiment in which the loudness level of an audio signal is adjusted, the present disclosure may be equally applied and extended to various multimedia signals including video signals as well as audio signals. Therefore, it is interpreted that what may be easily inferred by a person who belongs to the technical field to which the present disclosure belongs from the detailed description and embodiments of the present disclosure belongs to the scope of the present disclosure.

The invention claimed is:

1. An audio signal processing apparatus for controlling loudness level, the audio signal processing apparatus comprising:
   a receiver for receiving an input audio signal;
   a processor for generating loudness metadata corresponding to the input audio signal; and
   an outputter for transmitting the loudness metadata generated in the processor,
   wherein the processor is configured to:
   measure a loudness of the input audio signal to acquire loudness information of the input audio signal;
   convert the loudness information to generate the loudness metadata; and
   output the generated loudness metadata to an output device for outputting the input audio signal through the outputter, wherein the loudness information includes information representing a loudness ratio for each frequency of the input audio signal,
   wherein the loudness ratio for each frequency of the input audio signal is to be used, by an audio signal processing apparatus which controls a loudness level of the input audio signal using the loudness metadata, for obtaining a difference in loudness which is changed by a post-processing.

2. The audio signal processing apparatus of claim 1, wherein the post-processing includes at least one of an equalization, a reverberation, and a room compensation.

3. The audio signal processing apparatus of claim 1, wherein the post-processing
   includes applying output characteristics of an audio signal processing apparatus which controls a loudness level of the input audio signal using the loudness metadata.

4. The audio signal processing apparatus of claim 1, wherein the difference in loudness which is changed by the post-processing is to be obtained, by the audio signal processing apparatus which controls a loudness level of the input audio signal using the loudness metadata, based on information representing a loudness level for each band which is changed by the post-processing.

5. The audio signal processing apparatus of claim 4, wherein the difference in loudness which is changed by the post-processing is to be obtained, by the audio signal processing apparatus which controls a loudness level of the input audio signal using the loudness metadata, based on a dot product of the loudness level for each band which is changed by the post-processing and a loudness ratio for each frequency of the input audio signal.

6. The audio signal processing apparatus of claim 5, wherein the difference in loudness which is changed by the post-processing is a parameter to be obtained, by the audio signal processing apparatus which controls a loudness level of the input audio signal using the loudness metadata, based on a cognitive loudness characteristic.

7. The audio signal processing apparatus of claim 6, wherein the difference in loudness which is changed by the post-processing is obtained, by the audio signal processing apparatus which controls a loudness level of the input audio signal using the loudness metadata, based on a K-weighting filter.

8. An audio signal processing apparatus for controlling loudness level, the audio signal processing apparatus comprising:
  a processor for adjusting a output loudness level of an input audio signal, wherein the processor is configured to:
  receive loudness metadata corresponding to the input audio signal;
  parse the loudness metadata to acquire loudness information of the input audio signal, wherein the loudness information includes information representing a loudness ratio for each frequency of the input audio signal;
  obtain a difference in loudness which is changed by a post-processing based on the loudness ratio for each frequency of the input audio signal,
  determine a loudness gain of the input audio signal based on the difference in loudness which is changed by the post-processing and a target loudness level; and
  adjust an output loudness level of the input audio signal based on the loudness gain.

9. The audio signal processing apparatus of claim 8, wherein the processor outputs a generated output audio signal by applying a loudness limiter to the input audio signal.

10. The audio signal processing apparatus of claim 8, wherein the post-processing includes at least one of an equalization, a reverberation, and a room compensation.

11. The audio signal processing apparatus of claim 8, wherein the post-processing
  includes applying output characteristics of an audio signal processing apparatus which controls a loudness level of the input audio signal using the loudness metadata.

12. The audio signal processing apparatus of claim 8, wherein the processor obtains, based on information representing loudness level for each band which is changed by a post-processing, the difference in loudness by the post-processing.

13. The audio signal processing apparatus of claim 12, wherein the processor obtains, based on a dot product of the loudness level for each band which is changed by the post-processing and a loudness ratio for each frequency of the input audio signal, the difference in loudness by the post-processing.

14. The audio signal processing apparatus of claim 13, wherein the difference in loudness by the post-processing is a parameter obtained based on a cognitive loudness characteristic.

15. The audio signal processing apparatus of claim 14, wherein the processor obtains, based on a K-weighting filter, the difference in loudness by the post-processing.

16. A method of generating loudness metadata for an input audio signal by an audio signal processing apparatus comprising:
  receiving an input audio signal;
  measuring a loudness of the input audio signal to acquire loudness information of the input audio signal;
  converting the loudness information to generate the loudness metadata; and
  outputting the generated loudness metadata to an output device for outputting the input audio signal through an outputter, wherein the loudness information includes information representing a loudness ratio for each frequency of the input audio signal,
  wherein the loudness ratio for each frequency of the input audio signal is to be used, by an audio signal processing apparatus which controls a loudness level of the input audio signal using the loudness metadata, for obtaining a difference in loudness which is changed by a post-processing.

17. A method of adjusting an output loudness level of an input audio signal by an audio signal processing apparatus, comprising:
  receiving loudness metadata corresponding to the input audio signal;
  parsing the loudness metadata to acquire loudness information of the input audio signal, wherein the loudness information includes information representing a loudness ratio for each frequency of the input audio signal;
  obtaining a difference in loudness which is changed by a post-processing based on the loudness ratio for each frequency of the input audio signal,
  determining a loudness gain of the input audio signal based on the difference in loudness which is changed by the post-processing and a target loudness level; and
  adjusting an output loudness level of the input audio signal based on the loudness gain.

* * * * *